(12) United States Patent
Draxler et al.

(10) Patent No.: US 8,384,476 B2
(45) Date of Patent: Feb. 26, 2013

(54) ADAPTIVE DIGITAL PREDISTORTION OF COMPLEX MODULATED WAVEFORM USING PEAK AND RMS VOLTAGE FEEDBACK FROM THE OUTPUT OF A POWER AMPLIFIER

(75) Inventors: Paul J. Draxler, San Diego, CA (US); Bruce A. Judson, San Luis Obispo, CA (US); Aracely W. Forrester, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 63 days.

(21) Appl. No.: 12/189,681

(22) Filed: Aug. 11, 2008

(65) Prior Publication Data

US 2010/0033246 A1 Feb. 11, 2010

(51) Int. Cl.
 *H03F 1/26* (2006.01)
(52) U.S. Cl. .................................. 330/149; 375/297
(58) Field of Classification Search .............. 330/149; 375/297; 455/114.3
See application file for complete search history.

(56) References Cited

U.S. PATENT DOCUMENTS

| | | | |
|---|---|---|---|
| 5,212,814 A * | 5/1993 | Iwane | 455/107 |
| 6,452,446 B1 * | 9/2002 | Eisenberg et al. | 330/52 |
| 6,459,334 B2 * | 10/2002 | Wright et al. | 330/2 |
| 7,035,345 B2 | 4/2006 | Jeckeln et al. | |
| 7,071,777 B2 * | 7/2006 | McBeath et al. | 330/149 |
| 7,136,628 B2 * | 11/2006 | Yang et al. | 455/114.3 |
| 7,167,693 B2 * | 1/2007 | Bachman et al. | 455/127.1 |
| 7,259,630 B2 * | 8/2007 | Bachman et al. | 330/297 |
| 7,471,739 B1 * | 12/2008 | Wright | 375/297 |
| 7,590,190 B2 * | 9/2009 | Luke et al. | 375/297 |
| 7,634,240 B2 * | 12/2009 | Mitzlaff et al. | 455/127.3 |
| 7,741,903 B2 * | 6/2010 | Vinayak et al. | 330/127 |
| 7,899,416 B2 * | 3/2011 | McCallister et al. | 455/114.3 |
| 7,907,678 B2 * | 3/2011 | Mizuta et al. | 375/297 |
| 8,064,850 B2 * | 11/2011 | Yang et al. | 455/114.3 |
| 2005/0231279 A1 * | 10/2005 | Moffatt et al. | 330/149 |
| 2006/0098758 A1 * | 5/2006 | Luke et al. | 375/297 |
| 2007/0063772 A1 * | 3/2007 | Carichner et al. | 330/149 |
| 2009/0256630 A1 * | 10/2009 | Brobston | 330/2 |
| 2010/0039100 A1 * | 2/2010 | Sun et al. | 324/123 R |

FOREIGN PATENT DOCUMENTS

| | | |
|---|---|---|
| EP | 0544117 A1 | 6/1993 |
| WO | WO9851005 A1 | 11/1998 |
| WO | WO0105026 A1 | 1/2001 |

OTHER PUBLICATIONS

International Search Report and Written Opinion—PCT/US2009/053452, International Search Authority—European Patent Office—Oct. 12, 2009.

\* cited by examiner

*Primary Examiner* — Henry Choe
(74) *Attorney, Agent, or Firm* — Ramin Mobarhan

(57) ABSTRACT

Exemplary embodiments of the invention includes an amplifier and a processor that adapts a baseline or previous model of the input-output signal characteristic of the amplifier using metrics of the system, including peak power, peak voltage, average power, root mean square (RMS) voltage, samples of the output signal of the amplifier, or environmental metrics such as temperature, power supply voltage, signal frequency, etc. In particular, the system comprises an amplifier; a device to measure a metric of the system; a processor to generate a present model of the input-output signal characteristic of the amplifier based on the system metric; and a predistortion device to predistort the input signal for the amplifier based on the present amplifier model.

54 Claims, 14 Drawing Sheets

ADAPTIVE DIGITAL PREDISTORTION OF COMPLEX MODULATED WAVEFORM USING PEAK AND RMS VOLTAGE FEEDBACK FROM THE OUTPUT OF A POWER AMPLIFIER

BACKGROUND

1. Field

The present disclosure relates generally to radio frequency (RF) power amplifiers, and in particular, to a system and method of performing adaptive digital predistortion (DPD) of complex modulated waveform based on metrics of a system, such as average power or root mean square (RMS) voltage and peak power or voltage from the output of an RF power amplifier.

2. Background

In the wireless communications field, there is a general need for devices capable of transmitting more data within a given bandwidth, and at the same time achieving a reasonable or optimal power efficiency to conserve battery power. For instance, wireless devices have been designed with different modulation schemes, such as quadrature amplitude modulation (QAM) having 16, 32, or 64 constellations, to increase the data throughput within a given bandwidth. Additionally, wireless devices have also been designed using power amplifiers that are operate close to their saturation region, such as class A/B, B, C, and other class amplifiers, to improve the power consumption efficiency.

Because of the relatively high spectral efficiency of the data transmission, such wireless devices often have tight requirements on the allowable spectral leakage. In some cases, these requirements present a problem for operating power amplifiers close to their saturation regions because the nonlinearity characteristic of the amplifier causes significant spectral regrowth and in-band distortion. One solution is to backoff the operation of the amplifier into its linear region so as to reduce or prevent this distortion. However, this results in reduced power efficiency for the device, which has adverse impact on the battery life and continued use of the device.

Another solution is to operate the power amplifier near its saturation or nonlinear region, and use a predistortion device at the input of the amplifier to distort the input signal so as to correct or reduce the distortion of the output signal caused by the nonlinearity of the amplifier. There are generally two approaches: an open loop approach and a closed loop approach. The open loop approach typically works well as long as the nonlinear characteristic of the amplifier is accurately modeled and does not significantly change over time with environmental conditions. The closed loop approach involves providing adaptation to the predistortion device so that it can model the nonlinear characteristic of the power amplifier in "real time," and adjust the predistortion of the input signal in accordance with the present model of the amplifier. However, often these adaptation techniques are complicated and expensive, as discussed as follows.

FIG. 1 illustrates a block diagram of a typical closed loop transmitter system 100 that uses a demodulation technique to provide information about an output signal in order to apply predistortion of an input signal to compensate for distortion in the output signal caused by a power amplifier. In particular, the transmitter system 100 includes a digital predistortion (DPD) device 102, a digital-to-analog converter (DAC) 104, an automatic gain control (AGC) 106, an up converting mixer 108, and a power amplifier 110. The transmitter system 100 further includes a demodulation section including a power splitter 112, a pair of mixers 114 and 116, an oscillator 120, a 90° phase shifter 118, and a pair of filters 122 and 124.

The DPD device 102 predistorts an input baseband or intermediate frequency (IF) digital signal based on signals received from the demodulation section in order to achieve a target signal at the output of the power amplifier 110. The DAC 104 converts the predistorted digital signal from the DPD device 102 into an analog signal. The AGC 106 dynamically amplifies or attenuates the analog signal in order to achieve a target power level for the signal at the output of the power amplifier 110. The up converter mixer 108 uses a local oscillator (L.O.) to upconvert the baseband or IF analog signal into a radio frequency (RF) signal. The power amplifier 110 amplifies the RF signal to generate an output RF signal.

The demodulation section converts a sampled portion of the output RF signal into an I/Q IF or baseband signals for use by the DPD device 102 in predistorting the input digital signal to achieve a target RF output signal for the transmitter 100. The power splitter 112 splits the sampled output RF signal into two components for processing by the I- and Q-portions of the demodulation section. The mixer 114 uses the signal from the oscillator 120 to down convert the sampled output RF signal into an I-component IF or baseband signal. The filter 122 removes high order frequency components from the I-signal. Similarly, the mixer 116 uses the signal from the oscillator 120 shifted in phase by 90 degrees by the phase shifter 118 to down convert the sampled output RF signal into a Q-component IF or baseband signal. The filter 124 removes high order frequency components from the I-signal.

There are many drawbacks with the demodulation approach. For instance, the circuitry is very complex requiring a demodulation section to generate I- and Q-IF or baseband signals for use by the DPD device in predistorting the input digital signal to achieve a target output signal. The complexity is further underscored by the fact that the I- and Q-signals should be time aligned with the input signal for the system to operate properly. Further, the I- and Q-demodulation generally requires predistortion both in the amplitude domain and in the phase domain. Usually, a higher resolution DAC is required when predistorting of the input signal occurs in both the amplitude and frequency domains.

DETAILED DESCRIPTION

The word "exemplary" is used herein to mean "serving as an example, instance, or illustration." Any embodiment described herein as "exemplary" is not necessarily to be construed as preferred or advantageous over other embodiments. The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
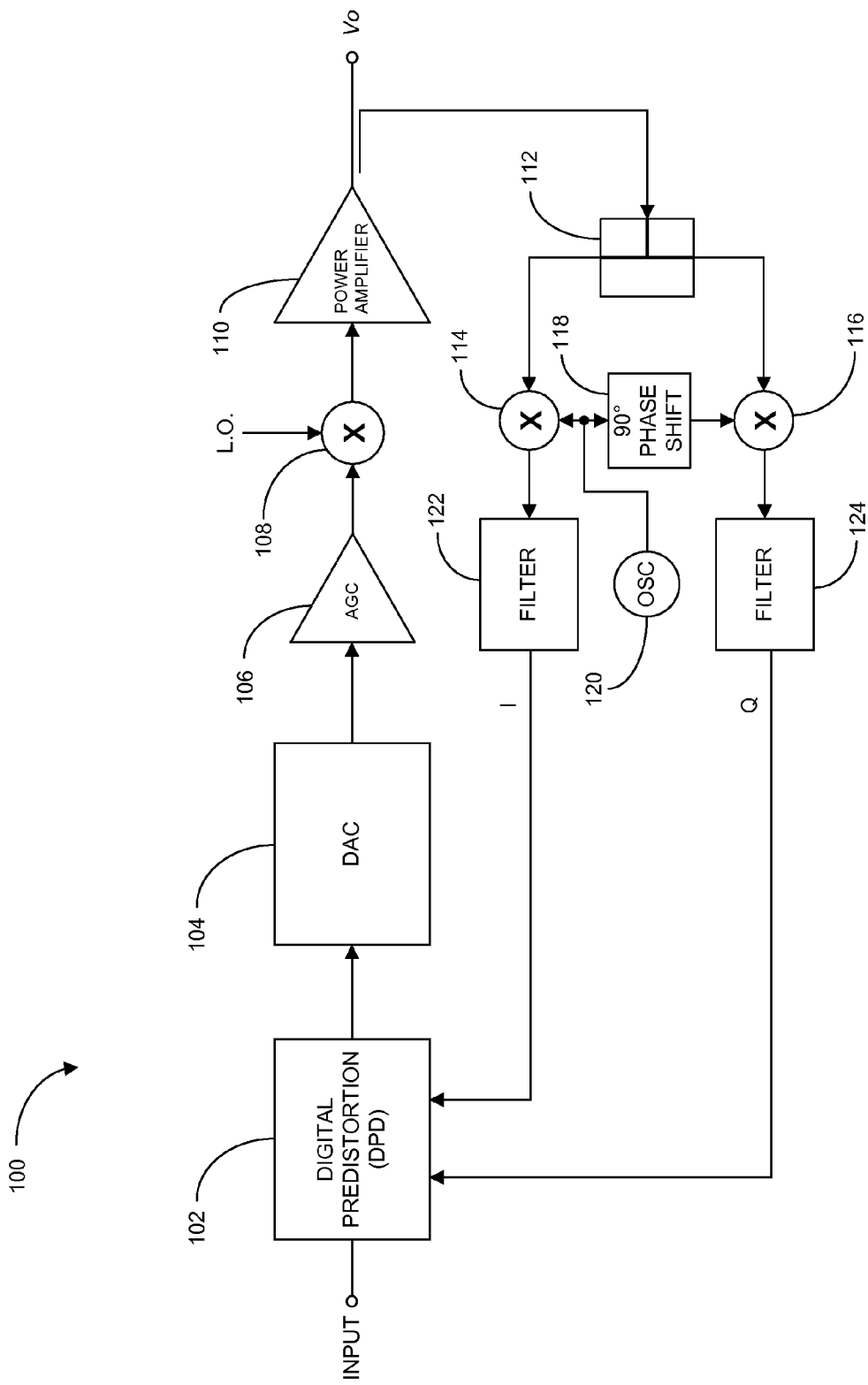
FIG. 1 illustrates a block diagram of a typical closed loop transmitter system that uses a demodulation technique to provide information about an output signal in order to apply predistortion of an input signal to compensate for distortion in the output signal caused by a power amplifier.
Figure 2:
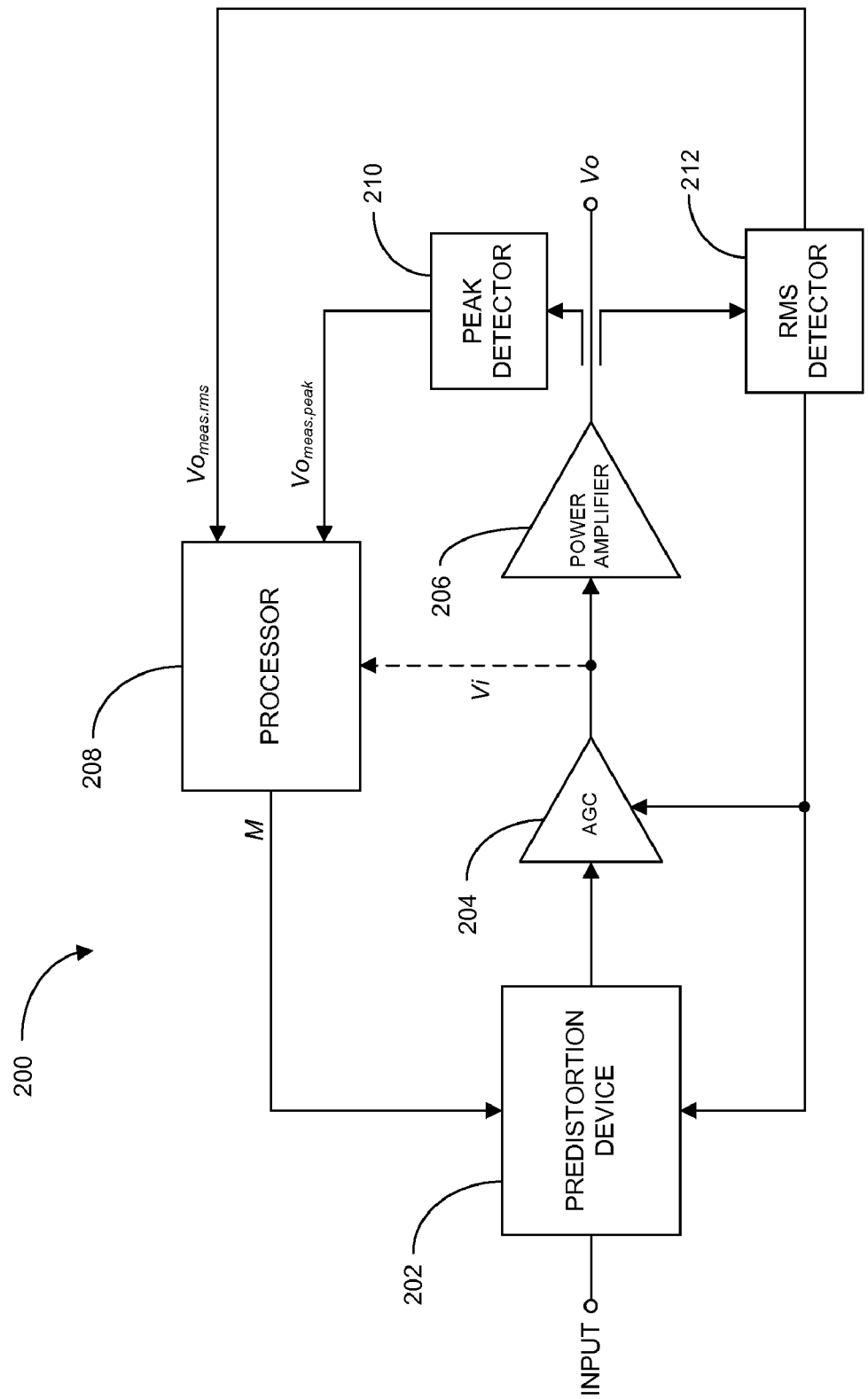
FIG. 2 illustrates a block diagram of an exemplary transmitter system including a power amplifier with an adaptive predistortion device in accordance with an exemplary embodiment of the disclosure.

FIG. 2 illustrates a block diagram of an exemplary transmitter system 200 including a power amplifier, an adaptive amplifier modeling device, and a predistortion device in accordance with an exemplary embodiment of the disclosure. In summary, the transmitter system 200 measures the average power or root mean square (RMS) voltage and peak power or peak voltage of the output signal generated by the power amplifier, and uses these inputs to build a model of the input-output signal characteristic of the power amplifier from a baseline or predetermined amplifier model. The transmitter system 200 further includes a predistortion device that modifies an input signal based on the adapted amplifier model to achieve a target output signal for the power amplifier.

In particular, the transmitter system 200 comprises a predistortion device 202, an automatic gain control (AGC) device 204, a power amplifier 206, a processor 208, a peak power or voltage detector 210, and an average power or RMS voltage detector 212. As discussed in more detail below, the predistortion device 202 distorts an input RF signal to achieve a target output RF signal for the power amplifier 206, such as to correct or reduce distortion of the output signal due to the nonlinearity characteristics of the transmitter 200, which includes power amplifier 206. The predistortion device 202 distorts the input RF signal based on an adapted amplifier model M of the power amplifier 206 developed by the processor 208.

The automatic gain control (AGC) device 204 modifies the power level of the predistorted RF signal generated by the predistortion device 202 in response to the measured average power or RMS voltage of the output RF signal as indicated by the RMS detector 212. One of the purposes of the AGC device 204 is to control the power level of the output RF signal. The power amplifier 206 amplifies the RF signal from the output of the AGC device 204 to generate the output RF signal Vo. As previously discussed, the power amplifier 206 may be operated in its nonlinear or near saturation region to improve the power efficiency of the transmitter system 200. As a result, the nonlinearity characteristic of the power amplifier 206 distorts the output RF signal, which is corrected or reduced by the predistorting of the input RF signal provided by the predistortion device 202.

As discussed in more detail below, the processor 208 builds an amplifier model M of the present input-output signal characteristic of the power amplifier 206. The processor 208 develops the model from the measured or estimated input signal $V_i$ of the power amplifier 206, the measured peak power or voltage $Vo_{meas.peak}$ of the output RF signal as indicated by the peak detector 210, the measured average power or RMS voltage $Vo_{meas.rms}$ of the output RF signal as indicated by the RMS detector 212, and a baseline or predetermined amplifier model. The processor 208 sends the adapted amplifier model M to the predistortion device 202, which uses the model in order to predistort the input RF signal to achieve a target or specified output RF signal. The following describes in more detail the amplifier model adaptation procedure performed by the processor 208, and the input signal predistorting procedure performed by the predistortion device 202.

Figure 3A:
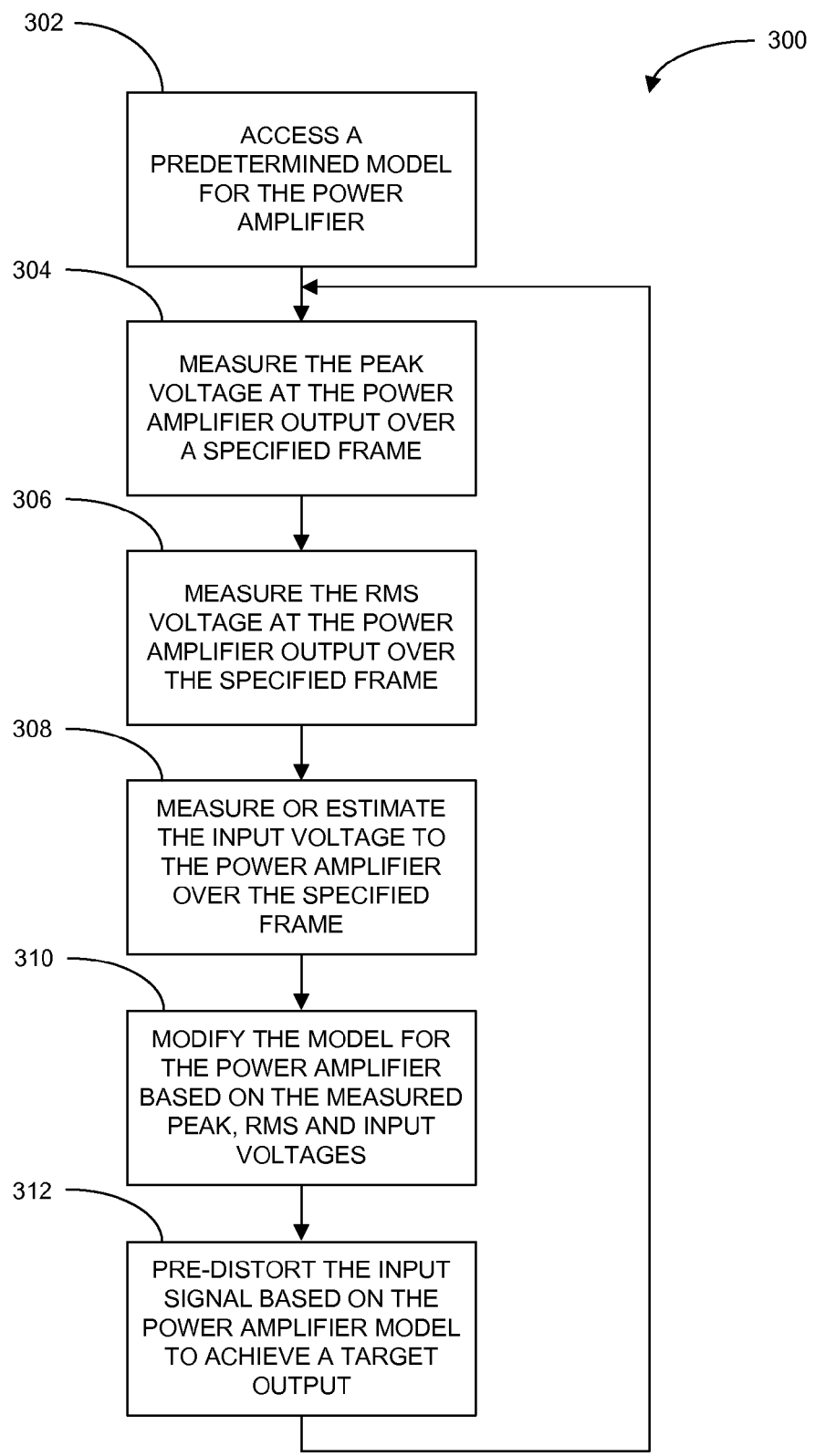
FIG. 3A illustrates a flow diagram of an exemplary method of adapting an amplifier model and using the adapted amplifier model to predistort an input signal to achieve a target output signal in accordance with another exemplary embodiment of the disclosure.

FIG. 3A illustrates a flow diagram of an exemplary method 300 of adapting an amplifier model, and using the adapted amplifier model to predistort an input signal to achieve a target output signal in accordance with another exemplary embodiment of the disclosure. In any of the concepts described herein, the order of performance is exemplary, and any order can be used which achieves substantially the same results. According to the method 300, the processor 208 accesses a baseline or predetermined amplifier model for the power amplifier 206 (block 302). The baseline amplifier model may have been developed by testing one or more of the same power amplifiers over some operational range (e.g., temperature, power supply voltage, frequency, etc.). The predetermined amplifier model may be a median or average of the performance characteristics of a sample set of the same type amplifiers. Optimally, this model should substantially minimize the error between the predetermined model and the actual performance of the power amplifier 206, or other suitable models based on other tests and/or observations.

During normal operations of the transmitter system 200, the processor 208 measures or estimates the peak power or voltage $Vo_{meas.peak}$ of the output RF signal of the power amplifier 106 as indicated by the peak detector 210 (block 304) for a sequence of n samples. The processor 208 also measures or estimates the average power or RMS peak voltage $Vo_{meas.rms}$ of the output RF signal of the power amplifier 206 as indicated by the RMS detector 212 for the sequence of n samples (block 306). Additionally, the processor 208 measures or estimates the input voltage Vi (the RF signal at the input of the power amplifier 206) for the sequence of n samples (block 308).

Based on these three inputs, e.g., the measured peak voltage $Vo_{meas.peak}$, the measured RMS voltage $Vo_{meas.rms}$, and the measured or estimated input voltage $V_i$, the processor 208 modifies the baseline or predetermined amplifier model so that it better reflects the actual performance of the power amplifier 206 (block 310). The processor 208 then sends the adapted (present) amplifier model to the predistortion device 202, which uses the present model to predistort the input signal to achieve a target or specified output RF signal for the transmitter system 200 (block 312). The method 300 then continues to block 304 where the process is repeated again. That is, the processor 208 again measures the voltages $Vo_{meas.peak}$, $Vo_{meas.rms}$, and Vi per respective blocks 304, 306, and 308, and then adapts the previous amplifier model developed in the prior cycle based on these new measurements per block 310. Alternatively, in block 310, the processor 208 may adapt the baseline or predetermined amplifier based on the new measurements. Again, per block 312, the predistortion model uses the adapted (present) amplifier model to distort the input RF signal to achieve a target or specified output RF signal. The method 300 continues to repeat operation blocks 304 through 312 as desired or specified. Any of the above-described operations may have appropriate validity checks to ensure that the adapted amplifier model substantially reflects the actual performance of the amplifier.

The specifics of the amplifier model adaptation process will now be discussed. It shall be understood that the following is merely one example of an amplifier model adaptation process that uses the measured peak and RMS voltages from the output of the power amplifier to adapt the model for the present performance of the power amplifier. The amplifier model may be configured as a look-up table indicating an input signal characteristic, such as the input amplitude $Vi_t(k)_i$ and a corresponding output signal amplitude $Vo_t(k)_i$, where k is the index for the look-up table and the subscript "i" indicates the present adaptation cycle. For example, if i=0, then the input and output amplitude characteristics $Vi_t(k)_0$ and $Vo_t(k)_0$ pertain to the baseline or predetermined amplifier model. If i=1, then the input and output amplitude characteristics $Vi_t(k)_1$ and $Vo_t(k)_1$ pertain to the adapted amplifier model after the completion of the first adaptation cycle. At any point in time, if a model is determined to be in error, it can be reset to the baseline or predetermined model.

The processor 208 may first determine the saturated voltage $Vo_{sat(i-1)}$ and low power gain $G_{lp(i-1)}$ pertaining to the previous amplifier model, using the following equations:

$$Vo_{sat(i-1)} = \max(Vo_t(k)_{(i-1)}) \qquad \text{Eq. 1}$$

$$Glp_{(i-1)} = Vo_t(2)_{(i-1)}/Vi_t(2)_{(i-1)} \qquad \text{Eq. 2}$$

Where $\max(Vo_t(k)_{(i-1)})$ is the maximum of the output amplitude characteristic of the previous amplifier model, and $Vi_t(2)_{(i-1)}$ and $Vo_t(2)_{(i-1)}$ are the second entry (k=2) of the input and output amplitude characteristics of the previous amplifier model. In this example, the second entry may be used because the first entry ((k=1)) may have significant noise associated with it because of the relatively small input voltage.

Then, the processor 208 measures or estimates n values of the voltage Vi at the input of the power amplifier 206. The processor 208 then determines which input amplitude characteristic $Vi_t(k(Vi))_{(i-1)}$ of the previous amplifier model corresponds to the measured or estimated voltage $Vi_i$. The processor 208 then uses this characteristic to estimate the gain $G(Vi)_{(i-1)}$ of the power amplifier 206 by using the following equation:

$$G(Vi_i)_{(i-1)} = Vo_t(k(Vi_i))_{(i-1)}/Vi_t(Vi_i))_{(i-1)} \qquad \text{Eq. 3}$$

Where $Vo_t(Vi_i))_{(i-1)}$ is the output amplitude characteristic of the previous amplifier model corresponding to the input amplitude characteristic $Vi_t(k(Vi_i))_{(i-1)}$. The processor 208 may then determine the estimated output voltage $Vo_{i.est}$ corresponding to the measured or estimated input voltage $Vi_i$ using the following equation:

$$Vo_{i.est} = G(Vi_i)*Vi_i \qquad \text{Eq. 4}$$

The processor 208 may also determine the estimated RMS output voltage $Vo_{i.est.rms}$ from the estimated output voltage $Vo_{1.est}$ using the following equation:

$$Vo_{i.est.rms} = \sqrt{\frac{\sum_{1}^{n} Vo_{i.est}^2}{n}} \qquad \text{Eq. 5}$$

Where n is the number of samples taken of the voltage $Vi_i$ at the input of the power amplifier for the specified frame. The processor 208 further determines the estimated output peak voltage $Vo_{i.est.peak}$ by using the following equation:

$$Vo_{i.est.peak} = \max[Vo_{i.est}] \text{ for set } \{Vi_{i1} \ldots Vi_{in}\} \qquad \text{Eq. 6}$$

Where $\{Vi_{i1} \ldots Vi_{in}\}$ is the set of n values of the input voltage $Vi_i$ for the specified frame.

The processor 208 then measures or estimates the current peak voltage $Vo_{i.meas.peak}$ and the current RMS voltage $Vo_{i.meas.peak}$ of the output of the power amplifier 206. Using the measured RMS voltage, the processor 208 may then determine the present low power gain $Glp_i$ of the power amplifier 206 using the following equation:

$$Glp_i = Glp_{(i-1)} \cdot \frac{Vo_{i.meas.rms}}{Vo_{i.est.rms}} \qquad \text{Eq. 7}$$

The processor 208 may also determine the present saturated voltage $Vo_{sati}$ using the following equation:

$$Vo_{sat_i} = Vo_{sat(i-1)} \cdot \frac{Vo_{i.meas.peak}}{Vo_{i.est.peak}} \qquad \text{Eq. 8}$$

The processor 208 may then determine the input amplitude characteristic $Vi_t(k)_i$ of the adapted amplifier model using the following equation:

$$Vi_t(k)_i = Vi_t(k)_{(i-1)} \cdot \frac{Vo_{sati}/Glp_i}{Vo_{sat(i-1)}/Glp_{(i-1)}} \qquad \text{Eq. 9}$$

The processor 208 may also determine the output amplitude characteristic $Vo_t(k)_i$ of the adapted amplifier model using the following equation:

$$Vo_t(k)_i = Vo_t(k)_{(i-1)} \cdot \frac{Glp_i}{Glp_{(i-1)}} \cdot \frac{Vi_t(k)_i}{Vi_t(k)_{(i-1)}} \qquad \text{Eq. 10}$$

And, as previously discussed, the adapted (present) amplifier model $Vi_t(k)_i$ and $Vo_t(k)_i$ may be used by the predistortion device 202 to predistort the input RF signal to the transmitter system 200 to achieve a target or specified output signal at the output of the power amplifier 206. This process may be continually repeated to adapt the amplifier model to better reflect its current performance.

Figure 3B:
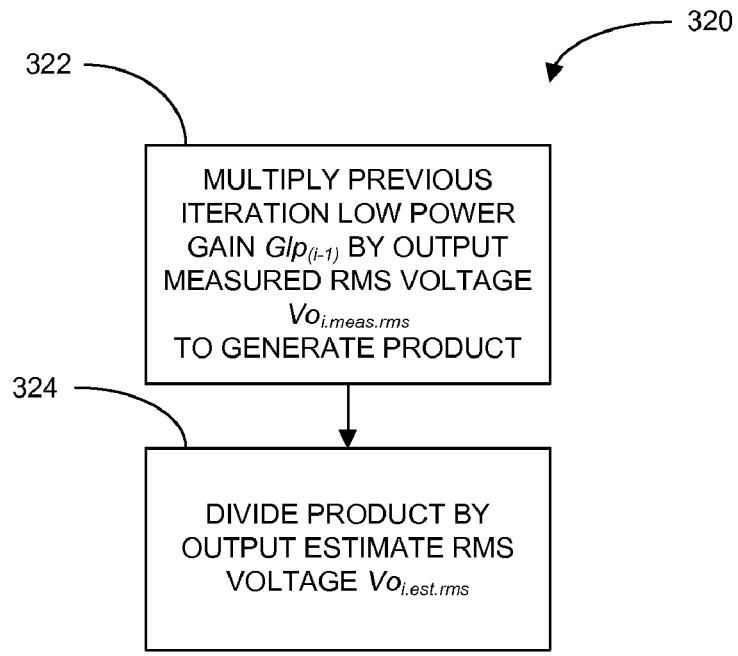
FIG. 3B illustrates a flow diagram of an exemplary method of determining a present low power gain $Glp_i$ of a present amplifier model in accordance with another exemplary embodiment of the disclosure.

FIG. 3B illustrates a flow diagram of an exemplary method 320 of determining a present low power gain $Glp_i$ of a present amplifier model in accordance with another exemplary embodiment of the disclosure. As previously discussed, the method 320 may be one of a number of operations performed in a process of developing a present amplifier model. Although the method 320 is described with reference to a particular order of steps, it shall be understood that the method may be implemented in any particular order and steps to achieve substantially the same results.

In particular, according to the method 320, the low power gain $Glp_{(i-1)}$ associated with a previous iteration of determining a previous amplifier model is multiplied by the measured RMS voltage $Vo_{i.meas.rms}$ of an output signal of the amplifier to generate a product (block 322). Then, according to the method 320, the product generated according to block 322 is divided by an estimate RMS voltage $Vo_{i.est.rms}$ of the output signal of the amplifier to generate the present low power gain $Glp_i$ (block 324).

Figure 3C:
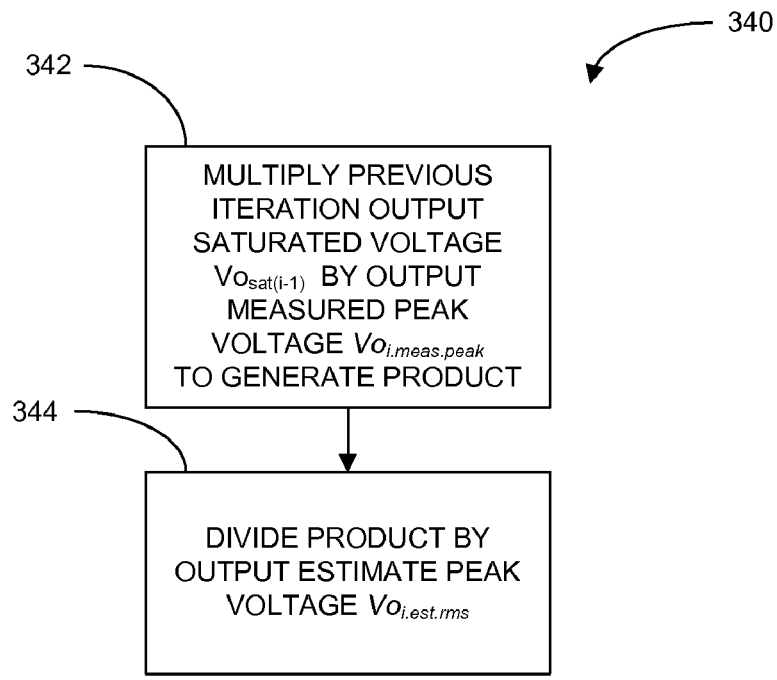
FIG. 3C illustrates a flow diagram of an exemplary method of determining a present saturated voltage $Vo_{sati}$ of a present amplifier model in accordance with another exemplary embodiment of the disclosure.

FIG. 3C illustrates a flow diagram of an exemplary method 340 of determining a present saturated voltage $Vo_{sati}$ of a present amplifier model in accordance with another exemplary embodiment of the disclosure. As previously discussed, the method 340 may be one of a number of operations performed in a process of developing a present amplifier model. Although the method 340 is described with reference to a particular order of steps, it shall be understood that the method may be implemented in any particular order and steps to achieve substantially the same results.

In particular, according to the method 340, the saturated voltage $Vo_{sat(i-1)}$ associated with a previous iteration of determining a previous amplifier model is multiplied by the measured peak voltage $Vo_{i.meas.peak}$ of an output signal of the amplifier to generate a product (block 342). Then, according to the method 340, the product generated according to block 342 is divided by an estimate peak voltage $Vo_{i.est.peak}$ of the output signal of the amplifier to generate the present saturated voltage $Vo_{sati}$ (block 344).

Figure 3D:
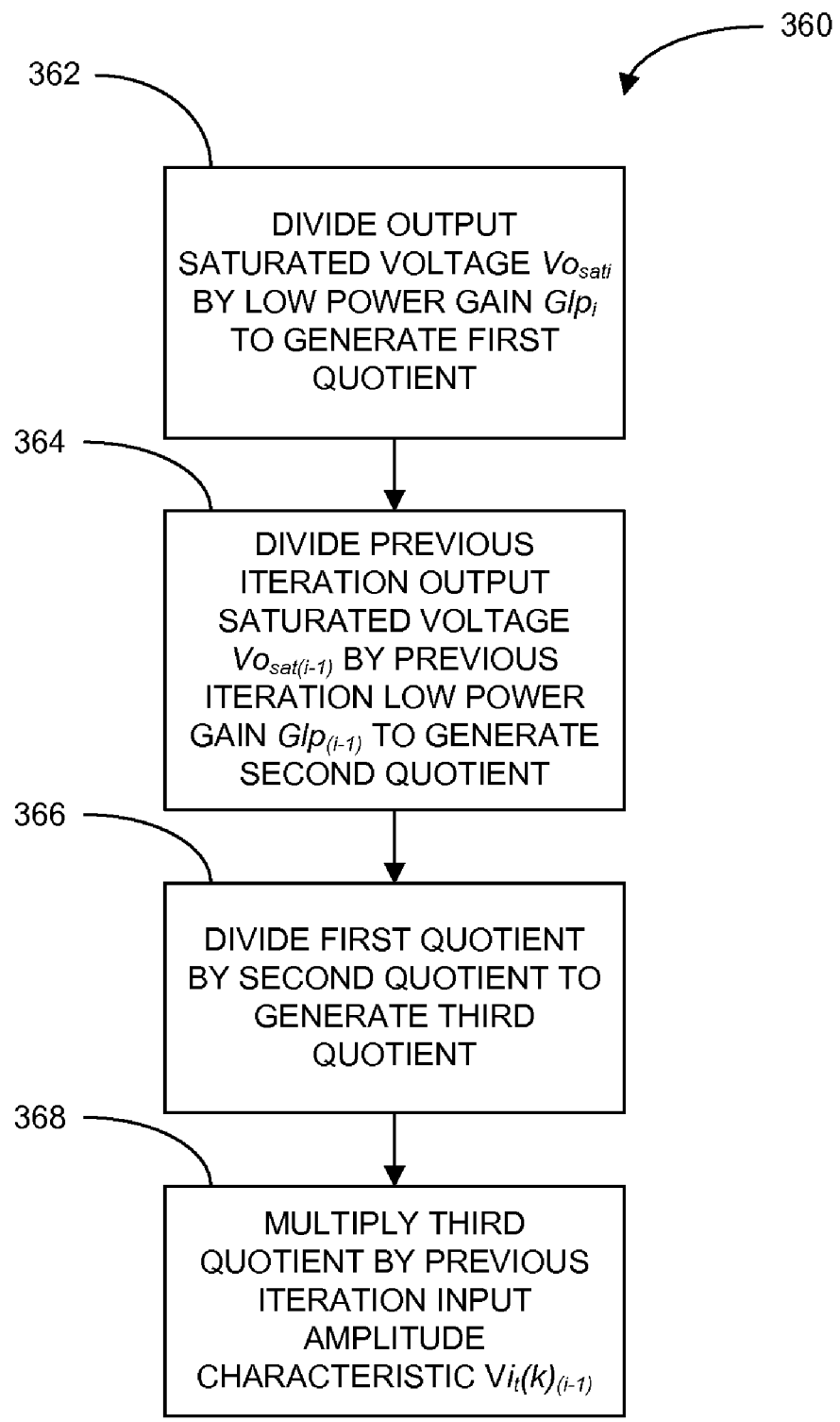
FIG. 3D illustrates a flow diagram of an exemplary method of determining an input amplitude characteristic $Vi_r(k)_i$ of a present amplifier model in accordance with another exemplary embodiment of the disclosure.

FIG. 3D illustrates a flow diagram of an exemplary method 360 of determining an input amplitude characteristic $Vi_t(k)_i$ of a present amplifier model in accordance with another exemplary embodiment of the disclosure. As previously discussed, the method 360 may be one of a number of operations performed in a process of developing a present amplifier model. Although the method 360 is described with reference to a particular order of steps, it shall be understood that the method may be implemented in any particular order and steps to achieve substantially the same results.

In particular, according to the method 360, the saturated voltage $Vo_{sati}$ associated with a present iteration of determining a present amplifier model is divided by the low power gain $Glp_i$ associated with the present iteration of determining present amplifier model to generate a first quotient (block 362). Then, according to the method 360, the saturated voltage $Vo_{sat(i-1)}$ associated with a previous iteration of determining a previous amplifier model is divided by the low power gain $Glp_{(i-1)}$ associated with the previous iteration of determining the previous amplifier model to generate a second quotient (block 364). Then, according to the method 360, the first quotient generated according to block 362 is divided by the second quotient generated according to block 364 to generate a third quotient (block 366). Then, according to the method 360, the third quotient generated according to block 366 is multiplied by an input amplitude characteristic $Vi_t(k)_{(i-1)}$ associated with the previous amplifier model, to generate the input amplitude characteristic $Vi_t(k)_i$ of the present amplifier model (block 368).

Figure 3E:
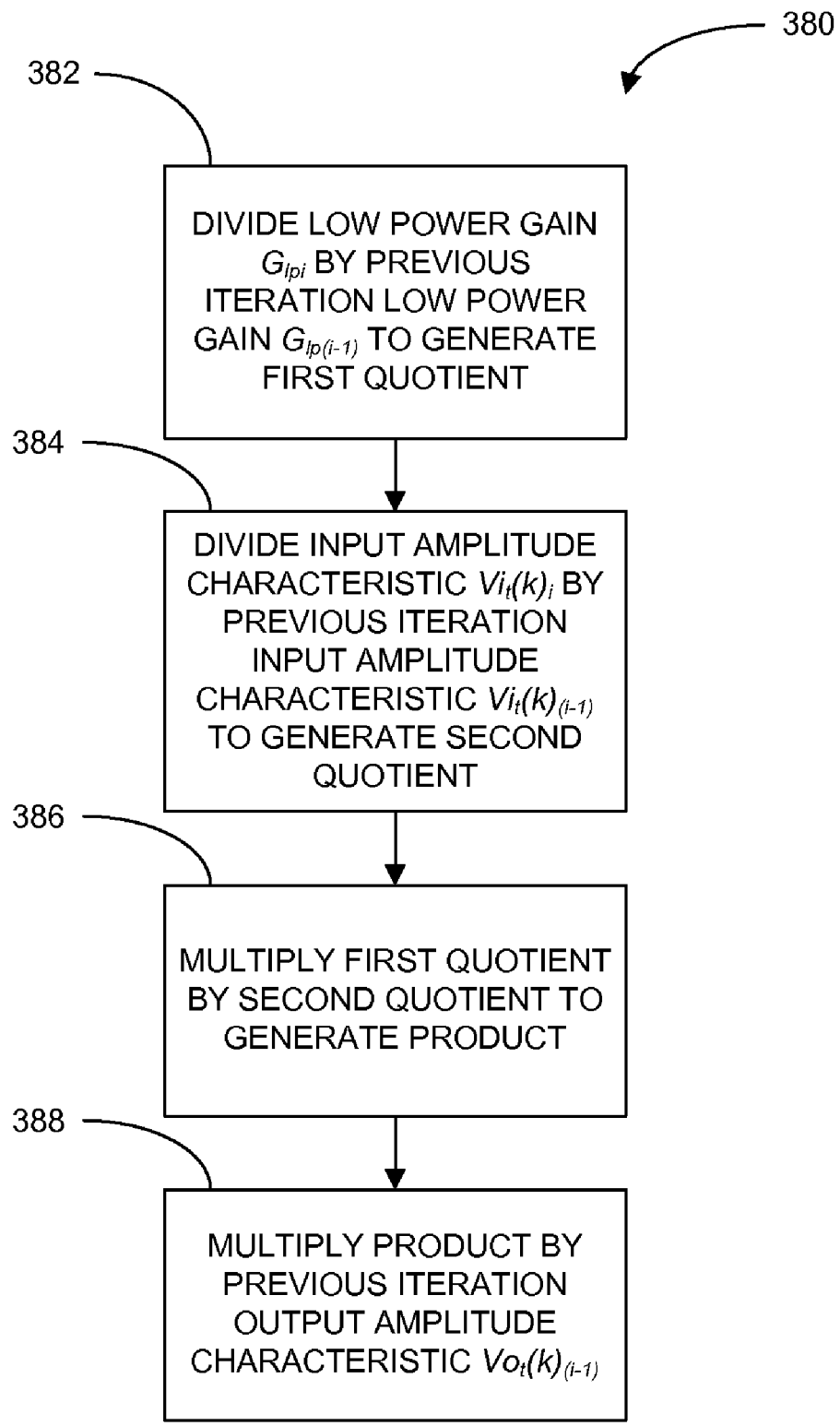
FIG. 3E illustrates a flow diagram of an exemplary method of determining an output amplitude characteristic $Vo_r(k)_i$ of a present amplifier model in accordance with another exemplary embodiment of the disclosure.

FIG. 3E illustrates a flow diagram of an exemplary method 380 of determining an output amplitude characteristic $Vo_t(k)_i$ of a present amplifier model in accordance with another exemplary embodiment of the disclosure. As previously discussed, the method 380 may be one of a number of operations performed in a process of developing a present amplifier model. Although the method 380 is described with reference to a particular order of steps, it shall be understood that the method may be implemented in any particular order and steps to achieve substantially the same results.

In particular, according to the method 380, the low power gain $Glp_i$ associated with a present iteration of determining a present amplifier model is divided by the low power gain $Glp_{(i-1)}$ associated with a previous iteration of determining a previous amplifier model to generate a first quotient (block 382). Then, according to the method 380, the input amplitude characteristic $Vi_t(k)_i$ associated with the present iteration of determining the present amplifier model is divided by an input amplitude characteristic $Vi_t(k)_{(i-1)}$ associated with the previous iteration of determining the previous amplifier model to generate a second quotient (block 384). Then, according to the method 380, the first quotient generated according to block 382 is multiplied by the second quotient generated according to block 384 to generate a product (block 386). Then, according to the method 380, the product generated according to block 386 is multiplied by an output amplitude characteristic $Vo_t(k)_{(i-1)}$ associated with the previous amplifier model, to generate the output amplitude characteristic $Vo_i(k)_i$ of the present amplifier model (block 388).

Figure 4:
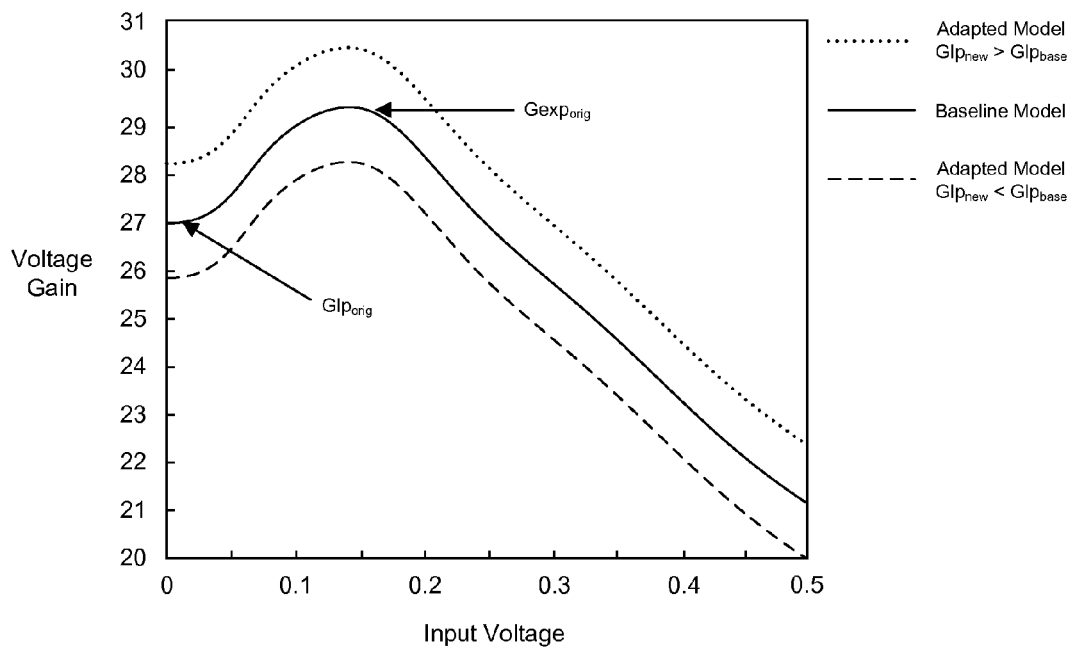
FIG. 4 illustrates a graph of exemplary gain responses of a power amplifier pertaining to an exemplary baseline amplifier model, an exemplary adapted amplifier model where the low power gain has been adjusted higher, and an exemplary adapted amplifier model where the low power gain has been adjusted lower in accordance with another exemplary embodiment of the disclosure.

FIG. 4 illustrates a graph of exemplary gain responses of a power amplifier pertaining to an exemplary baseline amplifier model, an exemplary adapted amplifier model where the low power gain has been adjusted higher, and an exemplary adapted amplifier model where the low power gain has been adjusted lower in accordance with another exemplary embodiment of the disclosure. As seen from the graph, the baseline amplifier model depicts a typical gain response for a power amplifier. It is typically characterized as having a gain that initially rises from a low power gain, in this example being approximate 27 dB, to a peak gain, in this example being approximately 29.3 dB. The rise in the gain is typically referred to as a gain expansion region. After the gain expansion region, the gain begins to decline due to the saturation characteristic of the power amplifier.

If, for example, in the first adaptation cycle the measured RMS voltage of the output RF signal of the power amplifier 106 is greater than the estimated RMS voltage of the output RF signal, then according to Eq. 7, the low power gain of the new amplifier model is greater than the low power gain of the baseline amplifier model. According to Eqs. 9 and 10, the effects of a higher low power gain produces an increase to the overall gain response of the adapted power amplifier model, as indicated by the graph. If, on the other hand, in the first adaptation cycle the measured RMS voltage of the output RF signal is less than the estimated RMS voltage of the output RF signal, then the low power gain of the adapted power amplifier model is less than the low power gain of the baseline amplifier model. The effects of a lower low power gain produces a decrease to the overall gain response of the power amplifier model, as indicated by the graph.

Figure 5:
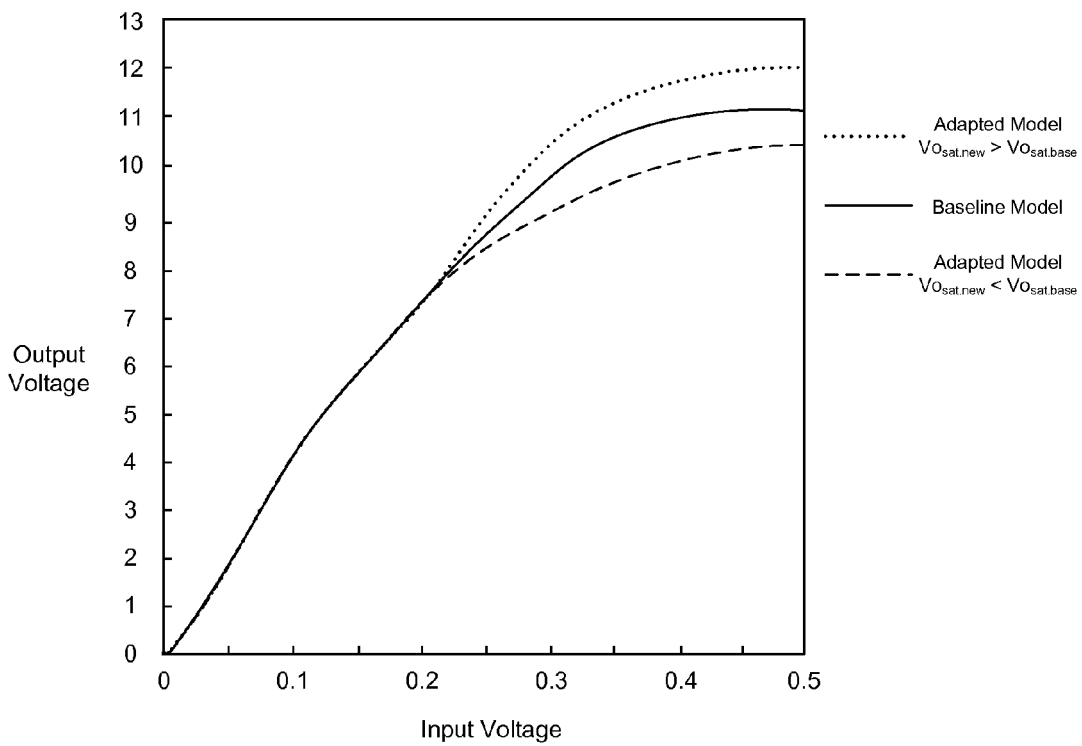
FIG. 5 illustrates a graph of exemplary saturation voltage responses of a power amplifier pertaining to an exemplary baseline amplifier model, an exemplary adapted amplifier model where the saturation voltage has been adjusted higher, and an exemplary adapted amplifier model where the saturation voltage has been adjusted lower in accordance with another exemplary embodiment of the disclosure.

FIG. 5 illustrates a graph of exemplary saturation voltage response of a power amplifier pertaining to an exemplary baseline amplifier model, an exemplary adapted amplifier model where the saturation voltage has been adjusted higher, and an exemplary adapted amplifier model where the saturation voltage has been adjusted lower in accordance with another exemplary embodiment of the disclosure. As seen from the graph, the typical saturation voltage response of a power amplifier is characterized as generally linear for low input voltages, with the exception of a gain expansion region as previously discussed. At higher input voltages, the power amplifier operates in a nonlinear fashion typically causing the slope of the output voltage to decrease with respect to the input voltage.

If, for example, in the first adaptation cycle the measured peak voltage of the output RF signal of the power amplifier 206 is greater than the estimated peak voltage of the output RF signal, then according to Eq. 8, the saturated voltage of the adapted amplifier model is greater than the saturated voltage of the baseline amplifier model. According to Eqs. 9 and 10, the effects of a higher saturated voltage produces an increased power in the saturated region of the power amplifier model, as indicated by the graph. If, on the other hand, in the first adaptation cycle the measured peak voltage of the output RF signal is less than the estimated peak voltage of the output RF signal, then the saturated voltage of the new amplifier model is less than the saturated voltage of the baseline amplifier model. The effects of a lower saturated voltage produces a decreased power in the saturated region of the power amplifier model, as indicated by the graph.

Figure 6A:
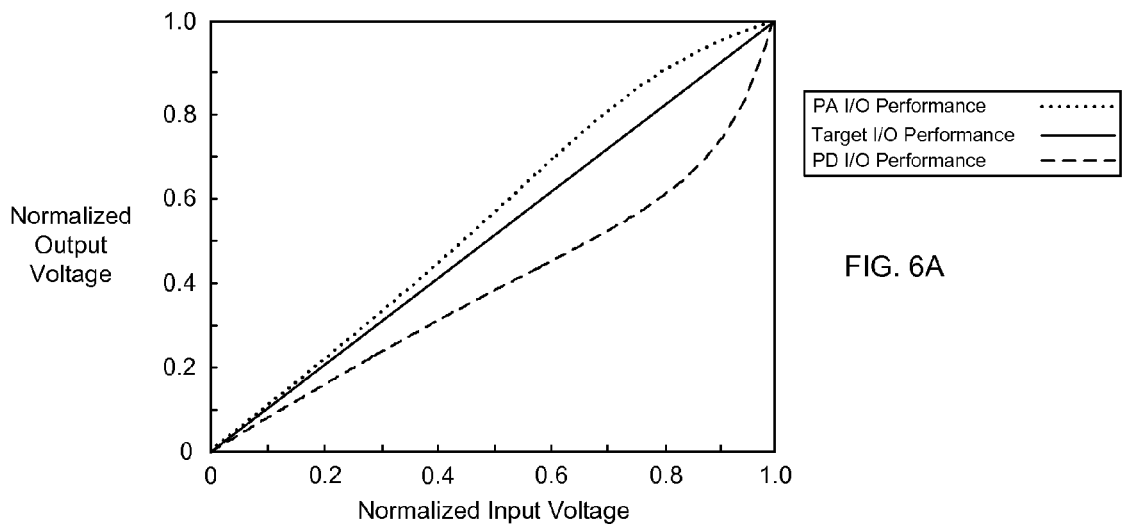
FIGS. 6A-C illustrate graphs of an exemplary normalized output-input voltage responses for the exemplary power amplifier, the predistortion device, and the transmitter system in accordance with another exemplary embodiment of the disclosure.
Figure 6B:
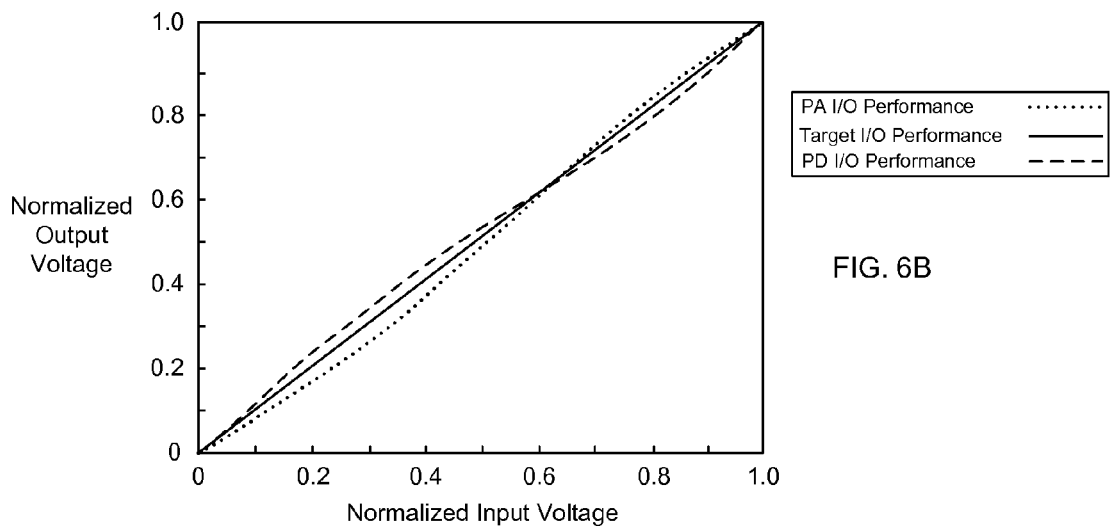
Figure 6C:
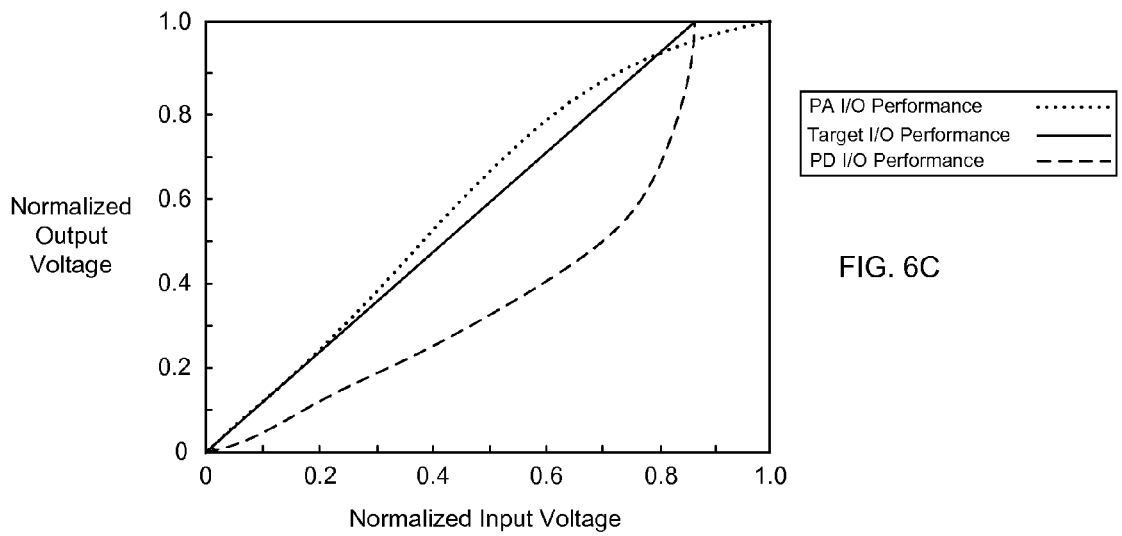

FIGS. 6A-C illustrate graphs of exemplary normalized output-input responses for the power amplifier, the predistortion device, and the transmitter system in accordance with another exemplary embodiment of the disclosure. The y-axis of the graphs indicates the normalized output voltage, where the value 1.0 indicates the target or specified maximum instantaneous output voltage of the power amplifier. The x-axis of the graphs indicates the normalized input voltage, where the value 1.0 indicates the input voltage that corresponds to the target or specified maximum instantaneous output voltage of the power amplifier. The upper graph (FIG. 6A) is an exemplary response where the average output power of the power amplifier 106 is set to a moderate level. The middle graph (FIG. 6B) is an exemplary response where the average output power is set to a relatively low level. The lower graph (FIG. 6C) is an exemplary response where the average output power is set to a relatively high level.

In these examples, the solid line on the graphs indicate the target or specified normalized output-input response for the transmitter system 200. As the graph illustrates, the target response may be primarily a linear response as indicated by the top and middle graphs. However, it shall be understood that the target response need not be substantially linear (FIG. 6C); e.g., clipping may occur. The dotted line of the graphs indicates the normalized input-output signal response for the power amplifier 206. The dashed line of the graphs indicates the normalized input-output signal response of the predistortion device 202. As these graphs illustrate, for a given normalized input level, the normalized input-output responses of the predistortion device 202 and the power amplifier 106 are situated on opposite sides of the target response. In this way, the input-output response of the predistortion device 202 combined with the input-output response of the power amplifier 206 should substantially produce the input-output target response for the transmitter system 200. As seen in FIG. 2, the predistortion device 202 receives an indication of the power level of the output RF signal via the RMS detector 212 for the purpose of indexing the adapted amplifier model and selecting the appropriate predistortion.

Figure 7:
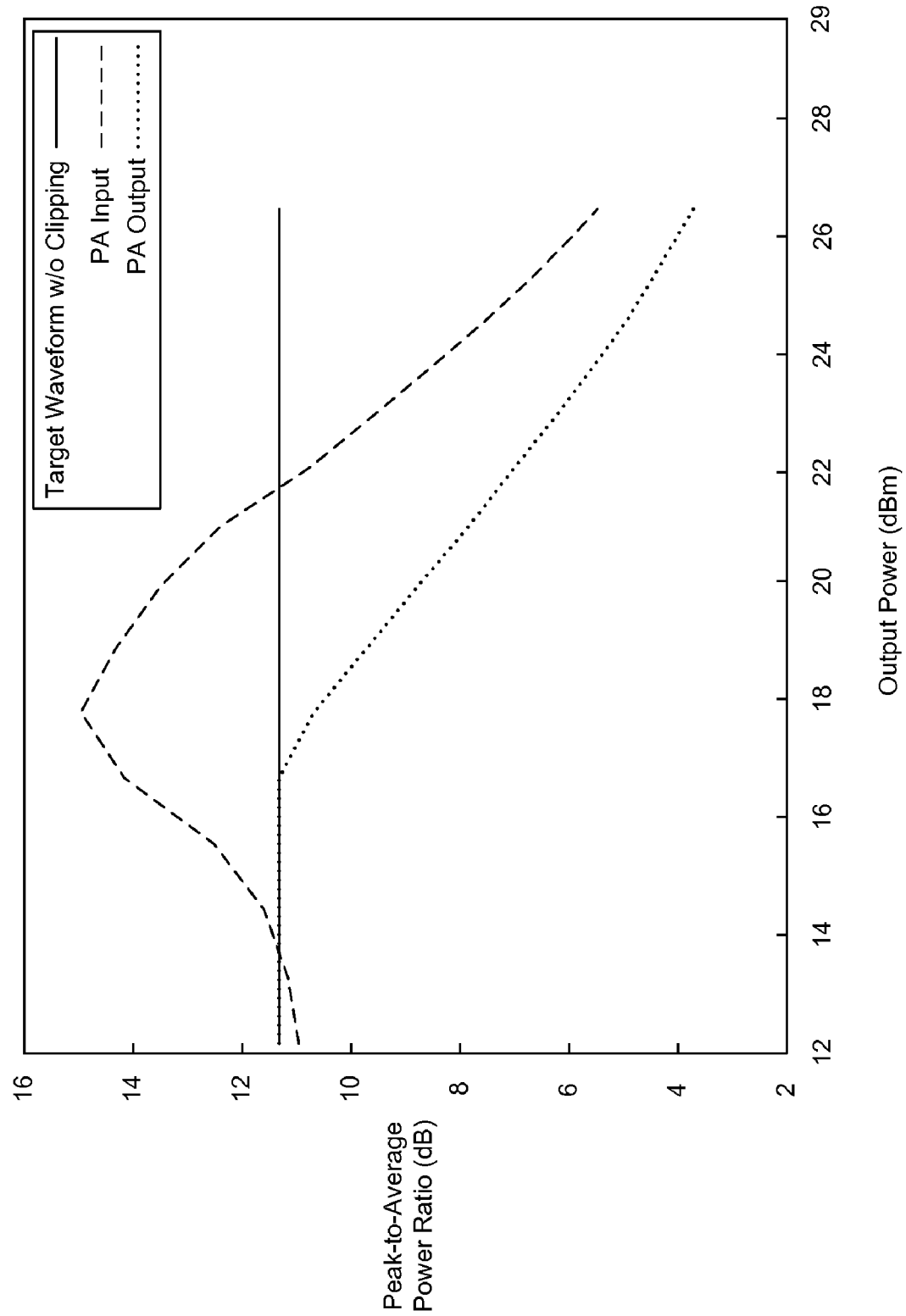
FIG. 7 illustrates a graph of an exemplary peak-to-average power ratio versus output power for the input, output, and target output of the power amplifier in accordance with another exemplary embodiment of the disclosure.

FIG. 7 illustrates a graph of an exemplary peak-to-average power ratio versus power for the input, output, and target output for the power amplifier 206 in accordance with another exemplary embodiment of the disclosure. The y-axis represents the peak-to-RMS ratio in dB for the corresponding signal, and the x-axis represents the average output power level in dBm for the corresponding signal. The dotted line represents the relationship between the peak-to-average power ratio to the average output power of the corrected output signal of the power amplifier 206. The dashed line represents the relationship between the peak-to-average power ratio to the average output power of the input signal of the power amplifier 206. And, the solid line represents the relationship between the peak-to-average power ratio to the power for the idealized or target output signal of the power amplifier 206.

As the graph illustrates, the peak-to-average power ratio value of the compensated output signal of the power amplifier 206 tracks the ideal values until the input signal hits the saturated power level, then decreases gradually above a power level of 17 dBm. This is due to the saturation properties of the power amplifier 206 that limit the maximum signal level. In order to compensate for the compression effects of the power amplifier 206, the predistortion device 202 performs signal crest enhancement by predistorting the input signal in order to increase the peak-to-average power ratio. This can be seen in the graph (from the dashed line) by the rise in the peak-to-RMS ratio of the input signal to the power amplifier 206. The overall effect of this compensation is to substantially maintain the peak-to-average ratio substantially constant over the operating range of the transmitter system 200, as illustrated by the substantially flat response of the power amplifier peak-to-average power ratio (dotted line), which is coincident with the target over the low and moderate power ranges.

Figure 8A:
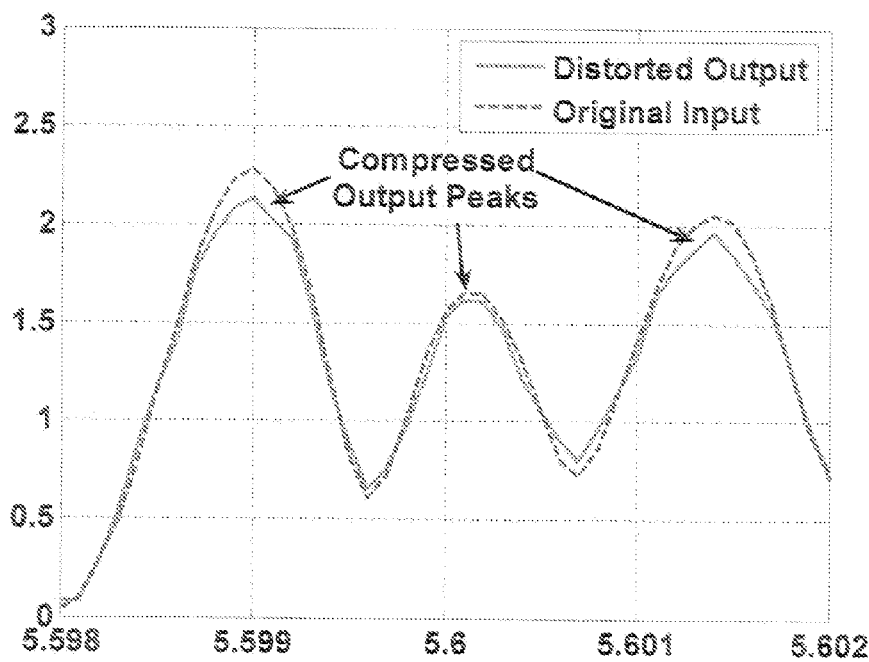
FIG. 8A illustrates a time-domain graph of exemplary undistorted or original input and distorted output signals in accordance with another exemplary embodiment of the invention.

FIG. 8A illustrates a time-domain graph of exemplary undistorted or original input and corresponding distorted output signals in accordance with another exemplary embodiment of the invention. The y- or vertical axis represents amplitude of the signals, and the x- or horizontal axis represents time. As the graph illustrates, the original input signal shown as a dashed line may not have compressed peaks as shown. However, the output signal shown as a solid line may have compressed peaks due to the non-linear characteristic of the power amplifier when operated near its saturation region.

Figure 8B:
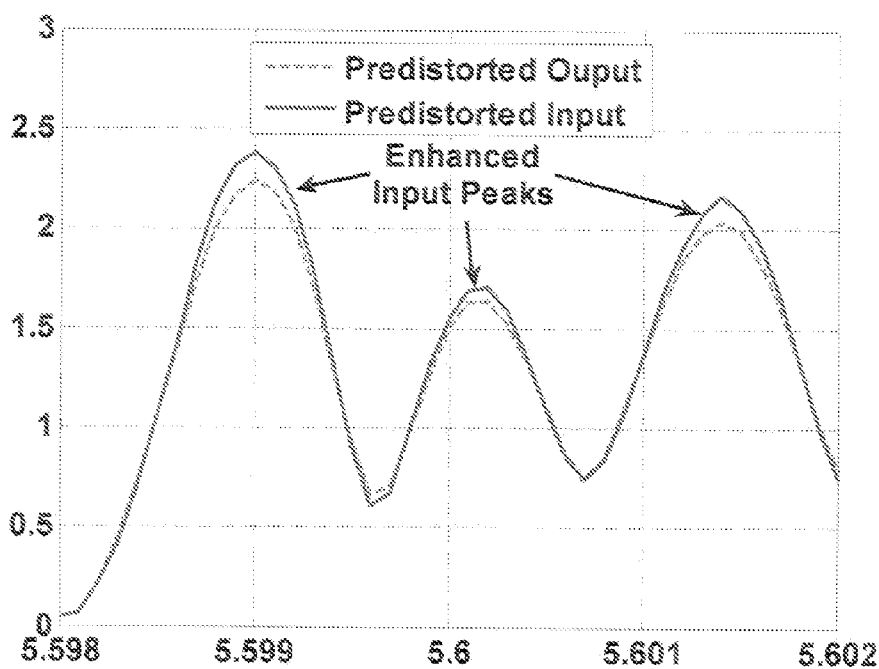
FIG. 8B illustrates a time-domain graph of exemplary predistorted input and output signals in accordance with another exemplary embodiment of the invention.

FIG. 8B illustrates a time-domain graph of exemplary predistorted input and output signals in accordance with another exemplary embodiment of the invention. Again, the y- or vertical axis represents amplitude of the signals, and the x- or horizontal axis represents time. As the graph illustrates, the input signal shown as a solid line has been predistorted by the predistortion device in order to enhanced its peaks as shown. The result is that the output signal shown as a dashed line no longer has compressed peaks. Thus, the amplifier modeling and predistortion techniques described herein may be used to achieve a target output signal, such as like the one shown in this graph.

Figure 9:
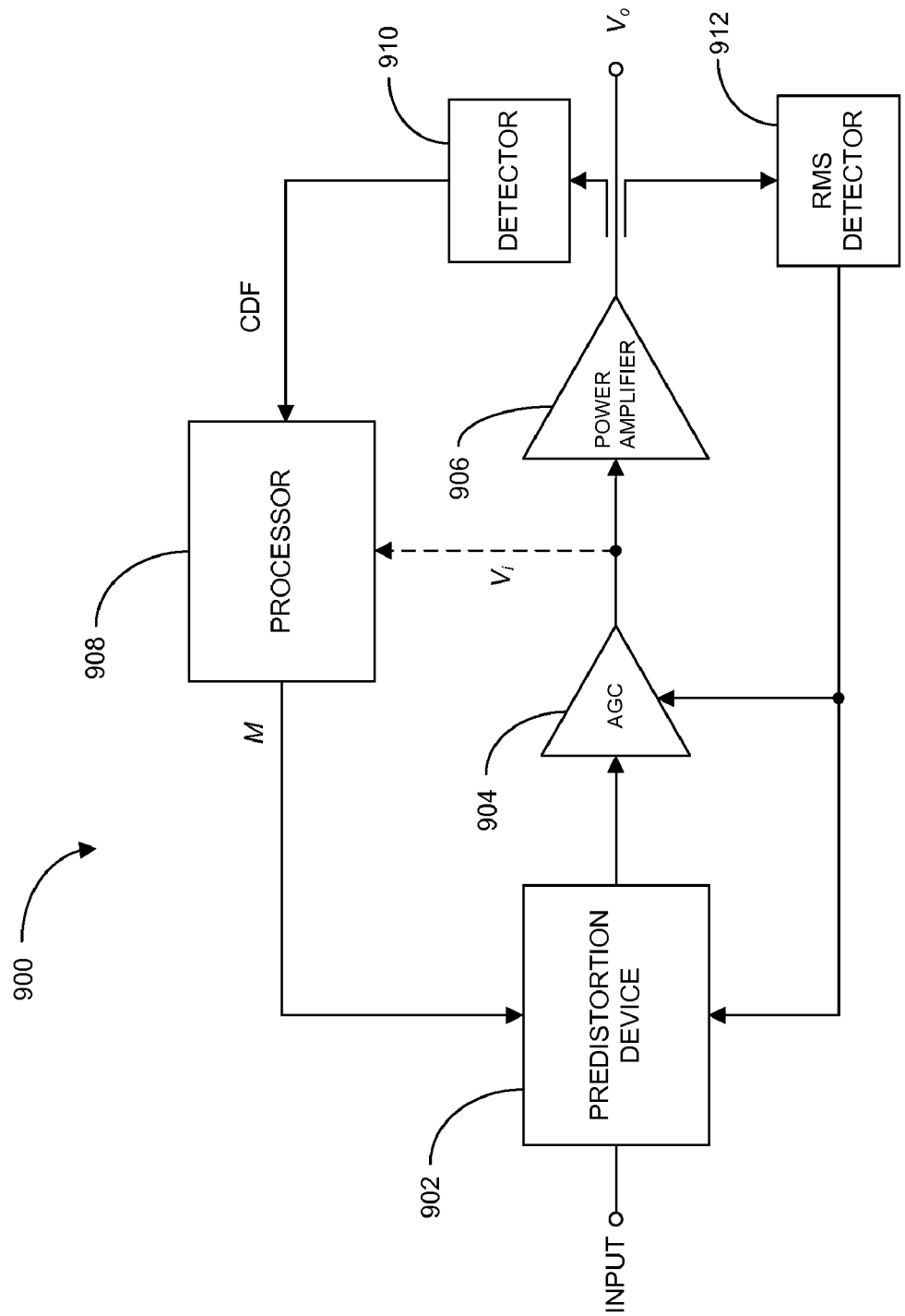
FIG. 9 illustrates a block diagram of another exemplary transmitter system including a power amplifier with an adaptive predistortion device in accordance with another exemplary embodiment of the disclosure.

FIG. 9 illustrates a block diagram of another exemplary transmitter system 900 including a power amplifier with an adaptive predistortion device in accordance with another exemplary embodiment of the disclosure. The transmitter system 900 is similar to transmitter system 200 and includes many of the same elements as indicated by the same reference numbers (except with the most significant digit being a "9" instead of a "2"). The transmitter system 900 differs from transmitter system 200 in that the processor 908 adapts the amplifier model from one or more points generated by a detector 910 that samples output metrics (related to the CCDF) of the output signal of the power amplifier 906. The processor 908, in turn, uses this signal to generate a complimentary cumulative distribution function (CCDF) of the output signal of the power amplifier 906. The CCDF indicates the probability that a given sample of the output signal will exceed a specified peak-to-average ratio value.

In essence, the CCDF provides a distribution of the power level of the output RF signal of the power amplifier 906. In the prior exemplary embodiment, the measured peak and average power or RMS voltage values were used to adapt the amplifier model for the actual performance of the power amplifier. However, other points in between the peak and RMS values may, in addition to or alternatively, be used by the processor 908 to adapt the amplifier model. The processor 908 may be configured to determine one or more points along the distribution function and use them to adapt the amplifier model.

Figure 10:
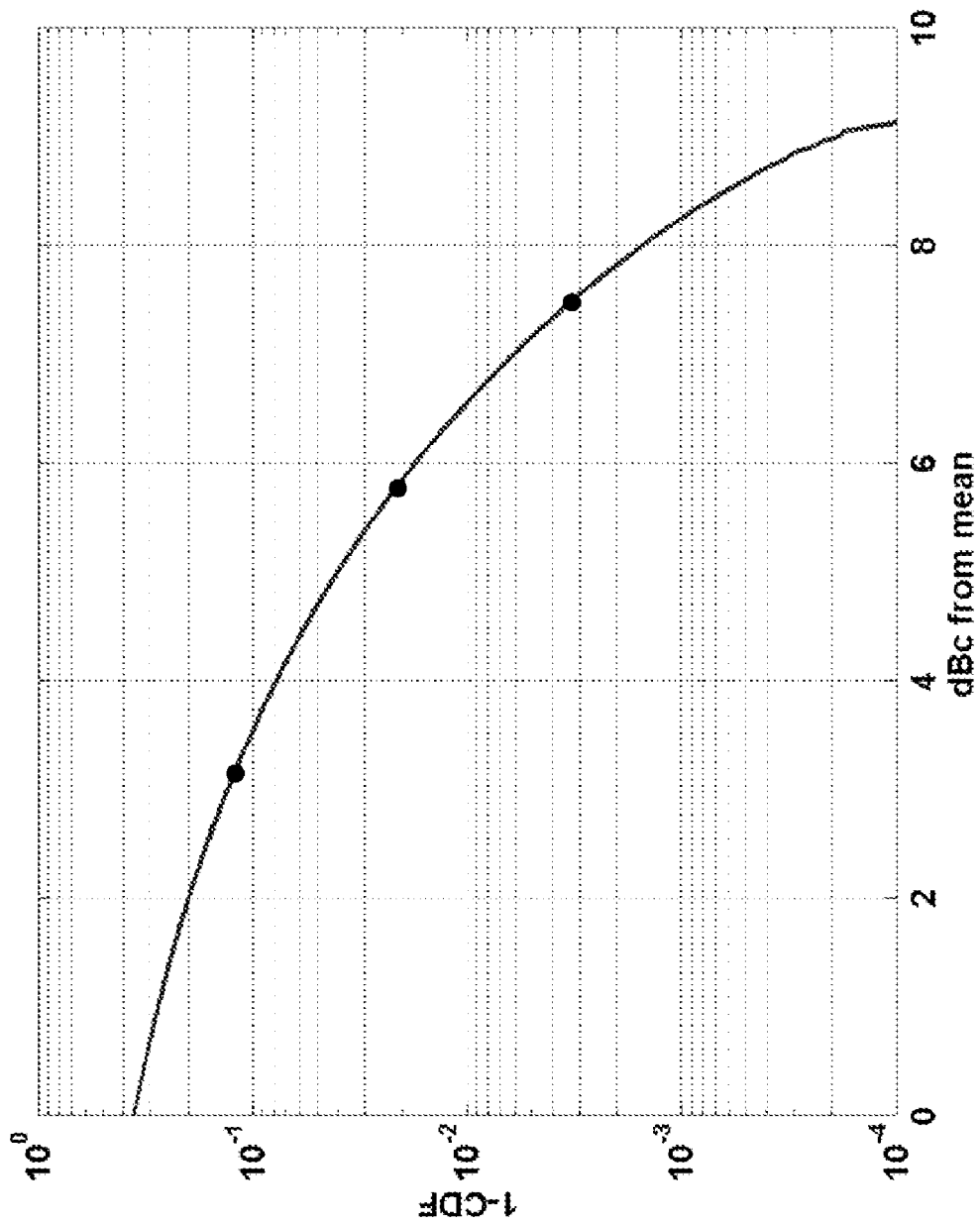
FIG. 10 illustrates a graph of an exemplary complimentary cumulative distribution function (CCDF=1−CDF) for the output signal of the power amplifier in accordance with another exemplary embodiment of the disclosure.

FIG. 10 illustrates a graph of an exemplary complimentary cumulative distribution function (CCDF=1−CDF) of the output signal of the power amplifier in accordance with another exemplary embodiment of the disclosure. The y-axis indicates the amount of time, in probability or percentage, that the signal power is at or above the power specified by the x-axis. The x-axis indicates the signal power of the output RF signal of the power amplifier. The zero (0) value of the x-axis indicates the average power or RMS voltage, and where the distribution curve crosses the x-axis indicates the peak relative to the average power or RMS voltage. Thus, instead of using the average power or peak voltage, the processor 208 may adapt the amplifier model based on intermediate points, three (3) of which are illustrated on the graph.

Figure 11:
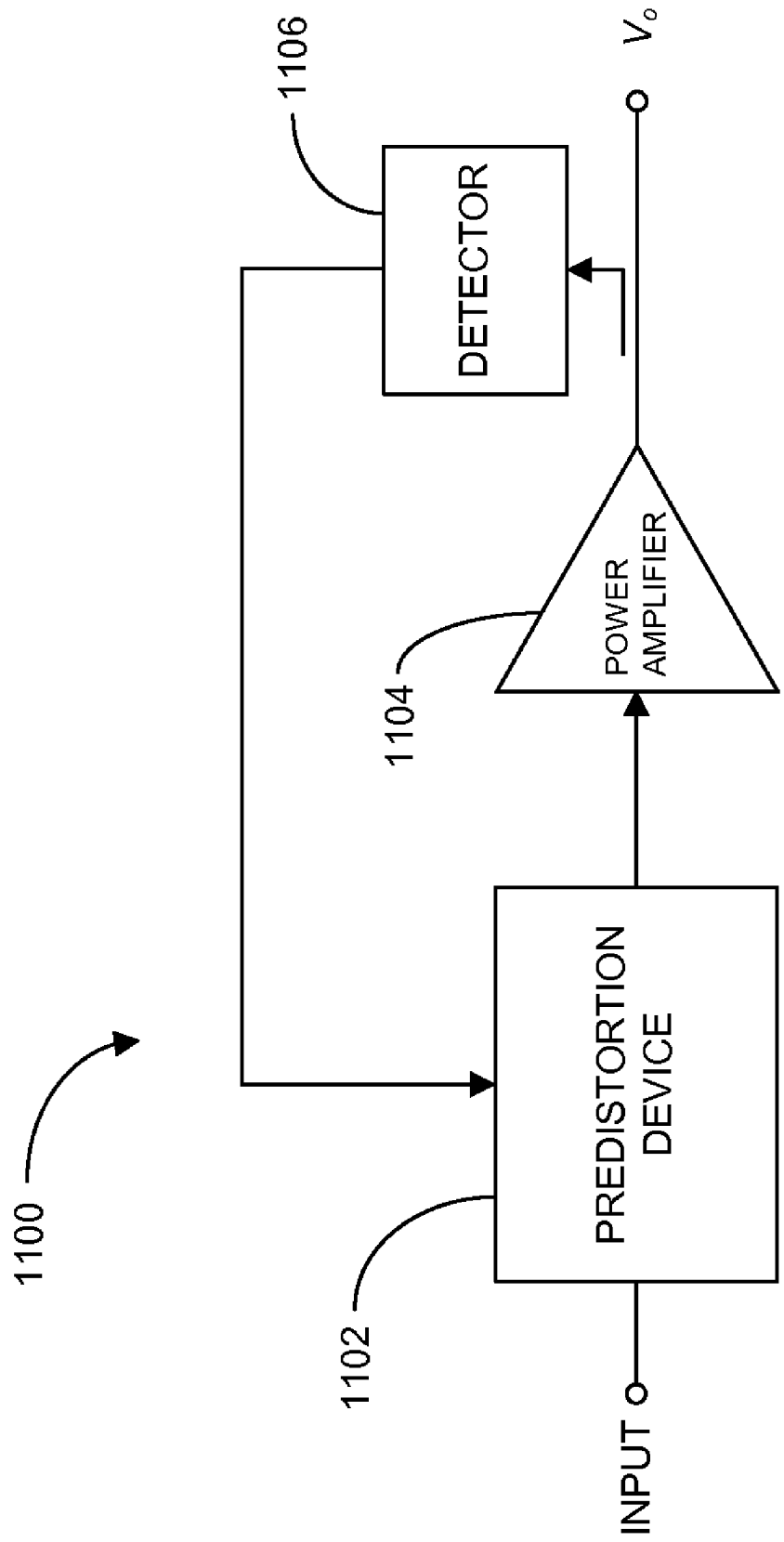
FIG. 11 illustrates a block diagram of yet another exemplary transmitter system including a power amplifier with an adaptive predistortion device in accordance with another exemplary embodiment of the disclosure.

FIG. 11 illustrates a block diagram of yet another exemplary transmitter system 1100 including a power amplifier with an adaptive predistortion device in accordance with another exemplary embodiment of the disclosure. In the prior exemplary embodiments, there was a separate unit for determining and adapting the amplifier model by measuring a parameter of the output signal of the power amplifier, and a separate unit for predistorting the input signal based on the present amplifier model to achieve a target output signal. In this exemplary embodiment, the functions of developing and adapting an amplifier model and predistorting the input based on the present amplifier model to achieve a target output signal is performed by a single unit, e.g., a predistortion device.

In particular, the transmitter system 1100 comprises a predistortion device 1102, a power amplifier 1104, and a detector 1106. The predistortion device 1102 receives a signal from the detector 1106 to develop a present amplifier model and predistort an input signal based on the present amplifier model to achieve a target output signal. The power amplifier 1104 amplifies the predistorted input signal from the predistortion device 1102 to generate an output signal. The detector 1106 detects a particular characteristic of the output signal. For example, the detector 1106 may measure an RMS voltage, peak voltage, average power, peak power, or it could be a detector that samples output metrics (related to the CCDF) of the output signal of the power amplifier. As previously discussed, the detector 1106 provides the measured or detected signal to the predistortion device 1102 for developing a present amplifier model of the power amplifier 1104 and predistorting the input signal accordingly.

Figure 12:
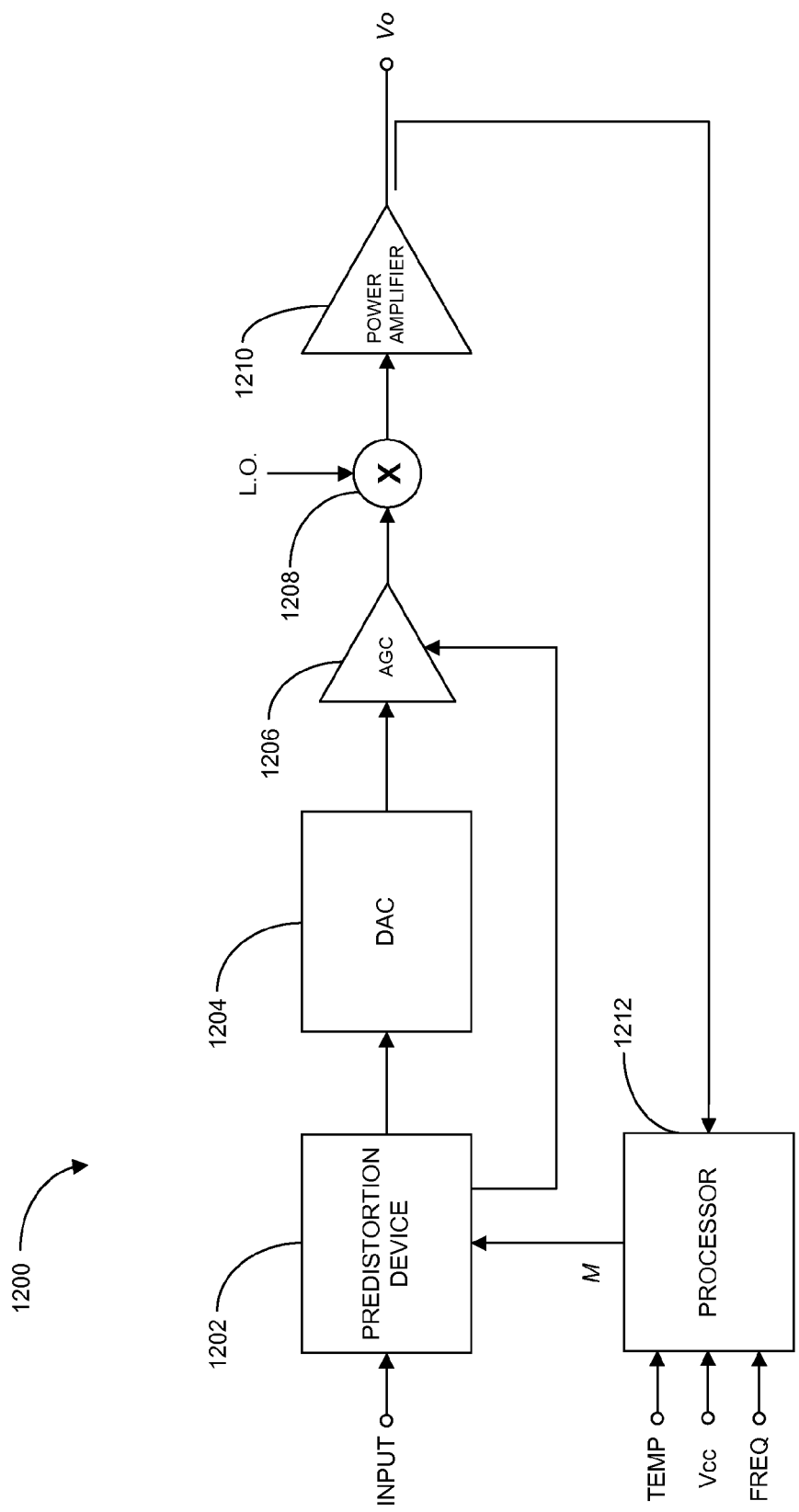
FIG. 12 illustrates a block diagram of still another exemplary transmitter system including a power amplifier with an adaptive predistortion device in accordance with another exemplary embodiment of the disclosure.

FIG. 12 illustrates a block diagram of still another exemplary transmitter system 1200 including a power amplifier with an adaptive predistortion device in accordance with another exemplary embodiment of the disclosure. The prior exemplary embodiments were generally closed loop exemplary embodiments relying on feedback from the output of the power amplifier to develop a present amplifier model and predistort the input signal based on the present amplifier model. In this exemplary embodiment, the transmitter system 1200 essentially adapts an open loop amplifier model based on various inputs of the environment, such as temperature, power supply voltage Vcc, and frequency of the signal being processed. The transmitter system 1200 may sample the output of the power amplifier 1210 in a relatively infrequent manner to keep the present amplifier model in check.

In particular, the transmitter system 1200 comprises a predistortion device 1202, a DAC 1204, an AGC 1206, a mixer 1208, a power amplifier 1210, and a processor 1212. The predistortion device 1202 predistorts an input signal, such as an IF or baseband input signal, based on a present amplifier model M generated by the processor 1212, to achieve a target signal at the output of the power amplifier 1210. The predistortion device 1202 may also control the AGC 1206 for the purpose of controlling the power of the output signal of the power amplifier 1210. If the input signal is digital, the DAC 1204 converts the predistorted digital signal generated by the predistortion device 1202 into an analog signal. The AGC 1206 may adjust the power level of the analog signal from the DAC 1204 in accordance with the signal it receives from the predistortion device 1202. If the input signal is an IF or baseband signal, the mixer 1208 up converts the input analog signal into an input RF signal. The power amplifier 1210 amplifies the input RF signal to generate an output RF signal.

The processor 1212 develops and adapts an amplifier model M for use by the predistortion device 1202 to predistort the input signal in order to achieve a target output signal for the transmitter system 1200. In this example, the processor 1212 initially uses a baseline amplifier model that may accurately model the performance of the power amplifier 1210 taking into account environmental conditions, such as temperature, power supply voltage Vcc, frequency of the signal being processed, and other inputs. The processor 1212 receives information about the present environment, such as temperature, Vcc, and frequency, and modifies the baseline amplifier model based on these inputs to develop a present amplifier model M. The processor 1212 then subsequently updates the present amplifier model M based on the environmental conditions.

This is essentially an open loop approach for developing a present amplifier model for the purpose of predistorting the input signal to achieve a target output signal. However, a sample of the output signal of the power amplifier 1210 may be provided to the processor 1212 for the purpose of making sure that the present amplifier model is accurate to within a predetermined specification. If the processor 1212 determines that the present amplifier model is not accurate per specification, the processor 1212 may modify the present amplifier model based on the sampled output signal to improve the accuracy of the model. As previously discussed, the processor 1212 may use the environmental condition information (e.g., temperature, Vcc, and frequency) as the primary factors in developing and adapting the present amplifier model, and use the sampled output signal from the power amplifier 1210 as a check and correction if necessary. Thus, the sampling of the output of the power amplifier 1210 need not be as frequent as in a closed loop configuration.

With regard to generally the rate of providing information of the power amplifier output for the purpose of developing an amplifier model and predistorting an input signal based on the amplifier model, it can be done at any rate in accordance with the exemplary embodiments previously discussed. For instance, the rate may be at the modulation rate of the RF output signal, which could be as high as 200 GHz. Alternatively, the rate may be at the envelope rate (e.g., at the modulation bandwidth). Alternatively, the rate may be at the power control rate, which may depend on the modulation rate and a scheduler. Alternatively, the rate may be at the model evolution rate, which may be based on changes in the operation environment parameters, such as temperature, power supply voltage Vcc, and frequency of the signal. The model evolution rate may be updated as necessary, and could be as fast as or faster than the power control rate.

It shall be understood the elements of the transmitter systems 200, 900, 1100, and 1200 discussed above may be implemented in the digital domain, analog domain, or a combination of the digital and analog domain. The systems 200, 900, 1100, and 1200 may further use dedicated hardware, programmable hardware, processor operating under the control of one or more software modules, or any combination thereof, to perform its intended functions as discussed above.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A system, comprising:
an amplifier;
a device to measure a metric of the system, the metric based on a detected power characteristic of an output RF signal of the amplifier;
a processor to generate a present amplifier model of an input-output signal characteristic of the amplifier based on the metric and a baseline amplifier model, wherein the present amplifier model and the baseline amplifier model are represented by one or more respective processor-executable characteristic representative equations; and
a predistortion device to predistort an input signal for the amplifier based on the present amplifier model.

2. The system of claim 1, wherein the metric measuring device comprises a detector for measuring an average power or a root mean square (RMS) voltage of an output signal of the amplifier.

3. The system of claim 1, wherein the metric measuring device comprises a detector for measuring a peak power or a peak voltage of an output signal of the amplifier.

4. The system of claim 1, wherein the metric measuring device comprises a detector for providing samples of output metrics related to a CCDF of an output signal of the amplifier.

5. The system of claim 1, wherein the metric comprises an environment temperature, a power supply voltage for the amplifier, or a frequency of a signal processed by the amplifier.

6. The system of claim 1, wherein the processor generates the present model based on the baseline or a predetermined model of the input-output signal characteristic of the amplifier.

7. The system of claim 1, wherein the processor generates the present model based on a previous model of the input-output signal characteristic of the amplifier.

8. The system of claim 1, wherein the predistortion device predistorts the input signal to achieve a target or specified output signal for the amplifier.

9. The system of claim 1, wherein the predistortion device predistorts the input signal to reduce distortion in an output signal of the amplifier.

10. The system of claim 1, wherein the predistortion device predistorts the input signal based additionally on an average power or RMS voltage of an output signal of the amplifier.

11. The system of claim 1, wherein the processor generates the present model based on a measurement or estimate of an input voltage to the amplifier.

12. The system of claim 1, wherein the processor generates the present model by modifying a previous model of the input-output signal characteristic of the amplifier based on the metric.

13. The system of claim 1, wherein the processor determines a present low power gain $Glp_i$ of the amplifier using substantially the following equation:

$$Glp_i = Glp_{(i-1)} \cdot \frac{Vo_{i,meas.rms}}{Vo_{i,est.rms}}$$

where i is a present iteration of determining the present amplifier model, $Glp_{(i-1)}$ is a low power gain associated with a previous iteration of determining a previous amplifier model, $Vo_{i,meas.rms}$ is a measured RMS voltage of an output signal of the amplifier, and $Vo_{i,est.rms}$ is an estimate RMS voltage of the output signal of the amplifier.

14. The system of claim 1, wherein the processor determines a present saturated voltage $Vo_{sat i}$ of the amplifier using substantially the following equation:

$$Vo_{sat_i} = Vo_{sat(i-1)} \cdot \frac{Vo_{i,meas.peak}}{Vo_{i,est.peak}}$$

where i is a present iteration of determining the present amplifier model, $Vo_{sat(i-1)}$ is a saturated voltage associated with a previous iteration of determining a previous amplifier model, $Vo_{i,meas.peak}$ is a measured peak voltage of an output signal of the amplifier, and $Vo_{i,est.peak}$ is an estimate peak voltage of the output signal of the amplifier.

15. The system of claim 1, wherein the processor determines an input amplitude characteristic $Vi_t(k)_i$ of the present amplifier model using substantially the following equation:

$$Vi_t(k)_i = Vi_t(k)_{(i-1)} \cdot \frac{Vo_{sati}/Glp_i}{Vo_{sat(i-1)}/Glp_{(i-1)}}$$

where i is a present iteration of determining the present amplifier model, $Vi_t(k)_{(i-1)}$ is an input amplitude characteristic associated with a previous amplifier model, $Vo_{sati}$ is a saturated associated with the present iteration of determining the present amplifier model, $Vo_{sat(i-1)}$ is a saturated voltage associated with a previous iteration of determining a previous amplifier model, $Glp_i$ is a low power gain associated with the present iteration of determining the present amplifier model, and $Glp_{(i-1)}$ is a low power gain associated with the previous iteration of determining the previous amplifier model.

16. The system of claim 1, wherein the processor determines an output amplitude characteristic $Vo_t(k)_i$ of the present amplifier model using substantially the following equation:

$$Vo_t(k)_i = Vo_t(k)_{(i-1)} \cdot \frac{Glp_i}{Glp_{(i-1)}} \cdot \frac{Vi_t(k)_i}{Vi_t(k)_{(i-1)}}$$

where i is a present iteration of determining the present amplifier model, $Vo_t(k)_{(i-1)}$ is an output amplitude characteristic associated with a previous amplifier model, $Vi_t(k)_i$ is an input amplitude characteristic associated with the present iteration of determining the present amplifier model, $Vi_t(k)_{(i-1)}$ is an input amplitude characteristic associated with the previous iteration of determining the previous amplifier model, $Glp_i$ is a low power gain associated with the present iteration of determining the present amplifier model, and $Glp_{(i-1)}$ is a low power gain associated with the previous iteration of determining the previous amplifier model.

17. The system of claim 1, wherein the processor determines one or more points of a probability distribution function of an output signal of the amplifier.

18. The system of claim 17, wherein the probability distribution function includes a complimentary cumulative distribution function (CCDF).

19. A method, comprising:
   measuring a metric of a system including an amplifier, the metric based on a detected power characteristic of an output RF signal of the amplifier;
   generating a present amplifier model of an input-output signal characteristic of the amplifier based on the metric and a baseline amplifier model, wherein the present amplifier model and the baseline amplifier model are represented by one or more respective processor-executable characteristic representative equations; and
   predistorting an input signal for the amplifier based on the present amplifier model.

20. The method of claim 19, wherein the metric comprises an average power or root mean square (RMS) voltage of an output signal of the amplifier.

21. The method of claim 19, wherein the metric comprises a peak power or peak voltage of an output signal of the amplifier.

22. The method of claim 19, wherein the metric comprises a plurality of samples of an output signal of the amplifier.

23. The method of claim 19, wherein the metric comprises an environment temperature, a power supply voltage for the amplifier, or a frequency of a signal processed by the amplifier.

24. The method of claim 19, wherein the present amplifier model is based on a baseline or predetermined model of the input-output signal characteristic of the amplifier.

25. The method of claim 19, wherein the present amplifier model is based on a previous model of the input-output signal characteristic of the amplifier.

26. The method of claim 19, wherein predistorting the input signal comprises predistorting the input signal to achieve a target or specified output signal for the amplifier.

27. The method of claim 19, wherein predistorting the input signal comprises predistorting the input signal to reduce distortion in the output signal.

28. The method of claim 19, wherein predistorting the input signal comprises predistorting the input signal based on a measurement of the average power or RMS voltage of an output signal of the amplifier.

29. The method of claim 19, wherein generating the present model is further based on a measurement or estimate of an input voltage to the amplifier.

30. The method of claim 19, wherein generating the present model comprises modifying an input-output signal characteristic of a previous amplifier model based on the metric.

31. The method of claim 19, wherein generating the present amplifier model comprises determining a present low power gain $Glp_i$ of the amplifier by:
   multiplying a low power gain $Glp_{(i-1)}$ associated with a previous iteration of determining a previous amplifier model by a measured RMS voltage $Vo_{i.meas.rms}$ of an output signal of the amplifier to generate a product; and
   dividing the product by an estimate RMS voltage $Vo_{i.est.rms}$ of the output signal of the amplifier.

32. The method of claim 19, wherein generating the present amplifier model comprises determining a present saturated voltage $Vo_{sati}$ of the amplifier by:
   multiplying a saturated voltage $Vo_{sat(i-1)}$ associated with a previous iteration of determining a previous amplifier model by a measured peak voltage $Vo_{i.meas.peak}$ of an output signal of the amplifier to generate a product; and
   dividing the product by an estimate peak voltage $Vo_{i.est.peak}$ of the output signal of the amplifier.

33. The method of claim 19, wherein generating the present amplifier model comprises determining an input amplitude characteristic $Vi_t(k)_i$ of the present amplifier model by:
   dividing a saturated voltage $Vo_{sati}$ associated with a present iteration of determining the present amplifier model by a low power gain $Glp_i$ associated with the present iteration of determining the present amplifier model to generate a first quotient;
   dividing a saturated voltage $Vo_{sat(i-1)}$ associated with a previous iteration of determining a previous amplifier model by a low power gain $Glp_{(i-1)}$ associated with the previous iteration of determining the previous amplifier model to generate a second quotient;
   dividing the first quotient by the second quotient to generate a third quotient; and
   multiplying the third quotient by an input amplitude characteristic $Vi_t(k)_{(i-1)}$ associated with the previous amplifier model.

34. The method of claim 19, wherein generating the present amplifier model comprises determining an output amplitude characteristic $Vo_t(k)_i$ of the present amplifier model by:
   dividing a low power gain $Glp_i$ associated with a present iteration of determining the present amplifier model by a low power gain $Glp_{(i-1)}$ associated with a previous iteration of determining a previous amplifier model to generate a first quotient;
   dividing an input amplitude characteristic $Vi_t(k)_i$ associated with the present iteration of determining the present amplifier model by an input amplitude characteristic $Vi_t(k)_{(i-1)}$ associated with the previous iteration of determining the previous amplifier model to generate a second quotient;
   multiplying the first quotient by the second quotient to generate a product; and
   multiplying the product by an output amplitude characteristic $Vo_t(k)_{(i-1)}$ associated with the previous amplifier model.

35. The method of claim 19, wherein generating the present amplifier model comprises determining one or more points of a probability distribution function of an output signal of the amplifier.

36. The method of claim 35, wherein the probability distribution function includes a complimentary cumulative distribution function (CCDF).

37. An apparatus, comprising:
   means for measuring a metric of a system including an amplifier, the metric based on a detected power characteristic of an output RF signal of the amplifier;
   means for generating a present amplifier model of an input-output signal characteristic of the amplifier based on the metric and a baseline amplifier model, wherein the present amplifier model and the baseline amplifier model are represented by one or more respective processor-executable characteristic representative equations; and
   means for predistorting the input signal of the amplifier based on the present amplifier model.

38. The apparatus of claim 37, wherein the metric measuring means comprises a detector for measuring an average power or root mean square (RMS) voltage of an output of the amplifier.

39. The apparatus of claim 37, wherein the metric measuring means comprises a detector for measuring a peak power or a peak voltage of an output signal of the amplifier.

40. The apparatus of claim 37, wherein the metric measuring means comprises a detector for providing samples of output metrics related to a CCDF of an output signal of the amplifier.

41. The apparatus of claim 37, wherein the metric comprises an environment temperature, a power supply voltage for the amplifier, or a frequency of a signal processed by the amplifier.

42. The apparatus of claim 37, wherein the present amplifier model is based on a baseline or predetermined model of the input-output signal characteristic of the amplifier.

43. The apparatus of claim 37, wherein the present amplifier model is based on a previous model of the input-output signal characteristic of the amplifier.

44. The apparatus of claim 37, wherein the predistorting means predistorts the input signal to achieve a target or specified output signal for the amplifier.

45. The apparatus of claim 37, wherein the predistorting means predistorts the input signal to reduce distortion in an output signal of the amplifier.

46. The apparatus of claim 37, wherein the predistorting means predistorts the input signal based on an average or root mean square (RMS) voltage of an output signal of the amplifier.

47. The apparatus of claim 37, wherein the present model generating means generates the present model of the input-output signal characteristic of the amplifier based on a measurement or estimate of an input voltage to the amplifier.

48. The apparatus of claim 37, wherein the present model generating means generates the present model by modifying an input-output signal characteristic of a previous model based on the metric.

49. The apparatus of claim 37, wherein the present model generating means determines a present low power gain $Glp_i$ of the amplifier using substantially the following equation:

$$Glp_i = Glp_{(i-1)} \cdot \frac{Vo_{i.meas.rms}}{Vo_{i.est.rms}}$$

where i is a present iteration of determining the present amplifier model, $Glp_{(i-1)}$ is a low power gain associated with a previous iteration of determining a previous amplifier model, $Vo_{i.meas.rms}$ is a measured RMS voltage of an output signal of the amplifier, and $Vo_{i.est.rms}$ is an estimate RMS voltage of the output signal of the amplifier.

50. The apparatus of claim 37, wherein the present model generating means determines a present saturated voltage $Vo_{sati}$ of the amplifier using substantially the following equation:

$$Vo_{sat_i} = Vo_{sat(i-1)} \cdot \frac{Vo_{i.meas.peak}}{Vo_{i.est.peak}}$$

where i is a present iteration of determining the present amplifier model, $Vo_{sat(i-1)}$ is a saturated voltage associated with a previous iteration of determining a previous amplifier model, $Vo_{i.meas.peak}$ is a measured peak voltage of an output signal of the amplifier, and $Vo_{i.est.peak}$ is an estimate peak voltage of the output signal of the amplifier.

51. The apparatus of claim 37, wherein the present model generating means determines an input amplitude characteristic $Vi_t(k)_i$ of the present amplifier model using substantially the following equation:

$$Vi_t(k)_i = Vi_t(k)_{(i-1)} \cdot \frac{Vo_{sati}/Glp_i}{Vo_{sat(i-1)}/Glp_{(i-1)}}$$

where i is a present iteration of determining the present amplifier model, $Vi_t(k)_{(i-1)}$ is an input amplitude characteristic associated with a previous amplifier model, $Vo_{sati}$ is a saturated associated with the present iteration of determining the present amplifier model, $Vo_{sat(i-1)}$ is a saturated voltage associated with a previous iteration of determining a previous amplifier model, $Glp_i$ is a low power gain associated with the present iteration of determining the present amplifier model, and $Glp_{(i-1)}$ is a low power gain associated with the previous iteration of determining the previous amplifier model.

52. The apparatus of claim 37, wherein the present model generating means determines an output amplitude characteristic $Vo_t(k)_i$ of the present amplifier model using substantially the following equation:

$$Vo_t(k)_i = Vo_t(k)_{(i-1)} \cdot \frac{Glp_i}{Glp_{(i-1)}} \cdot \frac{Vi_t(k)_i}{Vi_t(k)_{(i-1)}}$$

where i is a present iteration of determining the present amplifier model, $Vo_t(k)_{(i-1)}$ is an output amplitude characteristic associated with a previous amplifier model, $Vi_t(k)_i$ is an input amplitude characteristic associated with the present iteration of determining the present amplifier model, $Vi_t(k)_{(i-1)}$ is an input amplitude characteristic associated with the previous iteration of determining the previous amplifier model, $Glp_i$ is a low power gain associated with the present iteration of determining the present amplifier model, and $Glp_{(i-1)}$ is a low power gain associated with the previous iteration of determining the previous amplifier model.

53. The apparatus of claim 37, wherein the present model generating means determines one or more points of a probability distribution function of an output signal of the amplifier.

54. The apparatus of claim 53, wherein the probability distribution function includes a complimentary cumulative distribution function (CCDF).

* * * * *